United States Patent
Na et al.

(10) Patent No.: US 11,758,790 B2
(45) Date of Patent: Sep. 12, 2023

(54) DISPLAY DEVICE

(71) Applicant: Samsung Display Co., Ltd., Yongin-si (KR)

(72) Inventors: Hyunjae Na, Seoul (KR); Jaseung Ku, Seoul (KR); Kwan-ho Kim, Yongin-si (KR); Gyeongnam Bang, Seoul (KR); Hoseok Son, Seoul (KR); Sungyeon Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/948,130

(22) Filed: Sep. 19, 2022

(65) Prior Publication Data

US 2023/0016679 A1   Jan. 19, 2023

Related U.S. Application Data

(63) Continuation of application No. 17/402,870, filed on Aug. 16, 2021, now Pat. No. 11,450,717, which is a
(Continued)

(30) Foreign Application Priority Data

Aug. 28, 2017   (KR) ........................ 10-2017-0108874

(51) Int. Cl.
*G06F 3/041*    (2006.01)
*H10K 59/40*    (2023.01)
(Continued)

(52) U.S. Cl.
CPC ........... *H10K 59/40* (2023.02); *G06F 3/0412* (2013.01); *G06F 3/0443* (2019.05);
(Continued)

(58) Field of Classification Search
CPC ..... G06F 3/0446; G06F 3/0448; G06F 3/0443
See application file for complete search history.

(56) References Cited

U.S. PATENT DOCUMENTS 8,941,595 B2   1/2015   Dews
9,634,660 B2   4/2017   Trend et al.
(Continued)

FOREIGN PATENT DOCUMENTS

KR   10-2011-0079807   7/2011
KR   10-2013-0013070   2/2013
(Continued)

OTHER PUBLICATIONS

Notice of Allowance dated Oct. 7, 2019, in U.S. Appl. No. 16/012,767.
(Continued)

*Primary Examiner* — Kevin M Nguyen
(74) *Attorney, Agent, or Firm* — H.C. Park & Associates, PLC

(57) ABSTRACT

A display device including a first sensor part that includes a first trunk portion, a first branch portion connected to the first trunk portion and extending in a direction different from a first direction and a second direction, a second branch portion spaced apart from the first branch portion, and a bridge connecting the first branch portion to the second branch portion. A second sensor part includes a second trunk portion extending in the second direction, and a third branch portion disposed between the first branch portion and the second branch portion.

30 Claims, 24 Drawing Sheets

Related U.S. Application Data continuation of application No. 16/793,311, filed on Feb. 18, 2020, now Pat. No. 11,094,757, which is a continuation of application No. 16/012,767, filed on Jun. 20, 2018, now Pat. No. 10,572,086.

(51) Int. Cl.

| | | |
|---|---|---|
| *G06F 3/044* | (2006.01) | |
| *H10K 77/10* | (2023.01) | |
| *G02B 1/11* | (2015.01) | |
| *G02B 5/30* | (2006.01) | |
| *H10K 102/00* | (2023.01) | |

(52) U.S. Cl.
CPC .......... *G06F 3/0446* (2019.05); *G06F 3/0448* (2019.05); *H10K 77/111* (2023.02); *G02B 1/11* (2013.01); *G02B 5/3016* (2013.01); *G06F 2203/04102* (2013.01); *G06F 2203/04111* (2013.01); *G06F 2203/04112* (2013.01); *H10K 2102/311* (2023.02)

(56) References Cited

U.S. PATENT DOCUMENTS

| | | | |
|---|---|---|---|
| 9,836,167 | B2 | 12/2017 | Trend et al. |
| 9,886,127 | B2 | 2/2018 | Choi |
| 9,933,678 | B1 | 4/2018 | Chen et al. |
| 10,572,060 | B2 | 2/2020 | Lee et al. |
| 10,678,389 | B2 | 6/2020 | Gunji |
| 2010/0079393 | A1 | 4/2010 | Dews |
| 2010/0328208 | A1 | 12/2010 | Austin et al. |
| 2012/0169626 | A1 | 7/2012 | Hsieh |
| 2012/0229414 | A1 | 9/2012 | Ellis |
| 2014/0198268 | A1* | 7/2014 | Sugita .................. G06F 3/0412 349/12 |
| 2015/0085205 | A1 | 3/2015 | Chen et al. |
| 2017/0156218 | A1 | 6/2017 | Kogawa et al. |
| 2020/0057532 | A1 | 2/2020 | Wang |

FOREIGN PATENT DOCUMENTS

| | | |
|---|---|---|
| KR | 101401052 | 5/2014 |
| KR | 1020150111001 | 10/2015 |
| KR | 1020160014942 | 2/2016 |
| KR | 10-2018-0119196 | 11/2018 |
| KR | 102337621 | 12/2021 |

OTHER PUBLICATIONS

Non-Final Office Action dated Jan. 8, 2021, in U.S. Appl. No. 16/793,311.

Notice of Allowance dated Apr. 16, 2021, in U.S. Appl. No. 16/793,311.

Notice of Allowance dated Apr. 26, 2022, in U.S. Appl. No. 17/402,870.

\* cited by examiner

DISPLAY DEVICE

CROSS-REFERENCE TO RELATED APPLICATION

This application is a Continuation of U.S. patent application Ser. No. 17/402,870, filed Aug. 16, 2021, which is a Continuation of U.S. patent application Ser. No. 16/793,311, filed Feb. 18, 2020, now issued as U.S. Pat. No. 11,094,757, which is a Continuation of U.S. patent application Ser. No. 16/012,767, filed Jun. 20, 2018, now issued as U.S. Pat. No. 10,572,086, each of which claims priority from and the benefit of Korean Patent Application No. 10-2017-0108874, filed on Aug. 28, 2017, each of which is hereby incorporated by reference for all purposes as if fully set forth herein.

BACKGROUND

Field

Exemplary embodiments of the invention relate generally to a display device and, more specifically, to a display device including an input sensing unit.

Discussion of the Background

Electronic devices such as smart phones, tablets, notebook computers, navigation systems, and smart televisions have been developed. These electronic devices include display devices to provide information. The electronic devices further include various electronic modules in addition to the display devices.

The display devices include keyboards or mice as input units. In addition, the display devices may have touch panels as the input units.

The above information disclosed in this Background section is only for understanding of the background of the inventive concepts, and, therefore, it may contain information that does not constitute prior art.

SUMMARY

Exemplary embodiments of the invention may provide a display device including an input sensing unit with improved sensitivity.

A touch panel on a display device has a two sensing electrodes. As the thickness of the display device is reduced, the distance between the sensing electrodes and the user's fingers is reduced. Accordingly, the parasitic capacitance defined between the finger and the sensing electrodes has a great influence on the sensing sensitivity.

According to one or more embodiments of the invention, a display device may include a display panel, and an input sensing unit disposed on the display panel. The input sensing unit may include a first sensing electrode and a second sensing electrode, which have mesh shapes, respectively, and maybe insulated from each other.

The first sensing electrode may include first sensor parts arranged in a first direction, and first connection parts, each of which connects adjacent ones of the first sensor parts. The second sensing electrode may include second sensor parts arranged in a second direction intersecting the first direction, and second connection parts, each of which connects adjacent ones of the second sensor parts. Each of the first sensor parts may include a first trunk portion extending in the first direction, a first branch portion connected to the first trunk portion and extending in a direction different from the first direction and the second direction, a second branch portion spaced apart from the first branch portion, and a bridge connecting the first branch portion to the second branch portion. Each of the second sensor parts may include a second trunk portion extending in the second direction, and a third branch portion connected to the second trunk portion and extending in a direction different from the first direction and the second direction. The third branch portion may be disposed between the first branch portion and the second branch portion.

Each of the second sensor parts may include two or more third branch portions. Two third branch portions of the two or more third branch portions may be connected to each other, and the two third branch portions connect one end area of the second trunk portion to another end area of the second trunk portion. The second trunk portion and the two third branch portions define an opening.

The second branch portion may be disposed inside the opening.

The display device may further include a dummy electrode disposed in the opening.

The bridge may be disposed on a layer different from a layer on which the first branch portion is disposed.

The bridge may overlap with the third branch portion.

The first branch portion connects one end area of the first trunk portion to another end area of the first trunk portion. The first trunk portion and the first branch portion define an opening.

The display device may further include a dummy electrode disposed in the opening.

The first branch portion includes first areas and second areas that are alternately arranged, and widths of the first areas are greater than widths of the second areas. The third branch portion includes third areas and fourth areas that are alternately arranged, and widths of the third areas are greater than widths of the fourth areas. One of the first areas is disposed between adjacent two of the third areas.

A distance between the one of the first areas and one of the adjacent two third areas may range from 1 μm to 10 μm.

Each of the second sensor parts may include two or more third branch portions. One of the two or more third branch portions may be connected to one end area of the second trunk portion, and another of the two or more third branch portions may be connected to another end area of the second trunk portion. The one third branch portion may be spaced apart from the another third branch portion by a predetermined distance.

The bridge may be disposed between the one third branch portion and the another third branch portion.

A length of the one third branch portion may be substantially equal to a length of the another third branch portion.

The first connection parts and the second connection parts may be disposed on different layers from each other with an insulating layer interposed therebetween and disposed on the same layer as the first connection parts.

The input sensing unit may further include first dummy electrodes which overlap with the first sensor parts, are disposed on the same layer as the second connection parts, and are connected to the first sensor parts through contact holes penetrating the insulating layer, and second dummy electrodes which overlap with the second sensor parts, are disposed on the same layer as the second connection parts, and are connected to the second sensor parts through contact holes penetrating the insulating layer.

Each of the second sensor parts may include a plurality of third branch portions, and each of the second sensor parts may have a symmetrical shape with respect to the second trunk portion.

The display device may further include a window unit. The input sensing unit may be disposed between the display panel and the window unit, and a distance between a top surface of the input sensing unit and a top surface of the window unit may be 0.2 mm or less.

At least a partial area of the display device may be bendable.

In another aspect of the invention, a display device includes a display panel, and an input sensing unit including a first sensing electrode extending in a first direction, and a second sensing electrode extending in a second direction different from the first direction. The first sensing electrode and the second sensing electrode are insulated from each other.

The first sensing electrode may include a first extension extending in the first direction, a plurality of first diagonal portions connected to the first extension in an intersection area of the first and second sensing electrodes and extending in a direction different from the first and second directions, and a plurality of second diagonal portions spaced apart from the plurality of first diagonal portions and electrically connected to the first diagonal portions.

The second sensing electrode may include a second extension extending in the second direction, and a plurality of third diagonal portions connected to the second extension in the intersection area of the first and second sensing electrodes and disposed between the first diagonal portions and the second diagonal portions, respectively.

One of the first extension and the second extension may include a connection portion disposed on a layer different from a layer on which the first to third diagonal portions are disposed, and a first central portion and a second central portion which are spaced apart from each other and are disposed on the same layer as the first to third diagonal portions. The connection portion may be disposed between the first central portion and the second central portion in a plan view and may connect the first central portion and the second central portion to each other.

In still another aspect of the invention, a display device includes a display panel, a first sensing electrode disposed on the display panel, and a second sensing electrode disposed on the display panel and intersecting the first sensing electrode, wherein the first and second sensing electrodes are insulated from each other.

The first sensing electrode includes a first central portion extending in a first direction, a first branch portion defining a first opening along with the first central portion, and a second branch portion defining a second opening along with the first central portion. The second sensing electrode includes a second central portion extending in a second direction intersecting the first direction, a third branch portion defining a third opening along with the second central portion, a fourth branch portion defining a fourth opening along with the second central portion, a fifth branch portion spaced apart from the third branch portion and disposed in the second opening, and a sixth branch portion spaced apart from the fourth branch portion. A portion of the second branch portion is disposed between the third branch portion and the fifth branch portion.

A device constructed in accordance with an exemplary embodiment may increase a variation in capacitance before and after input since a facing area between the first and second sensing electrodes is increased and the overlapping areas of the input means (user's finger) and the first and second sensing electrodes are reduced.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
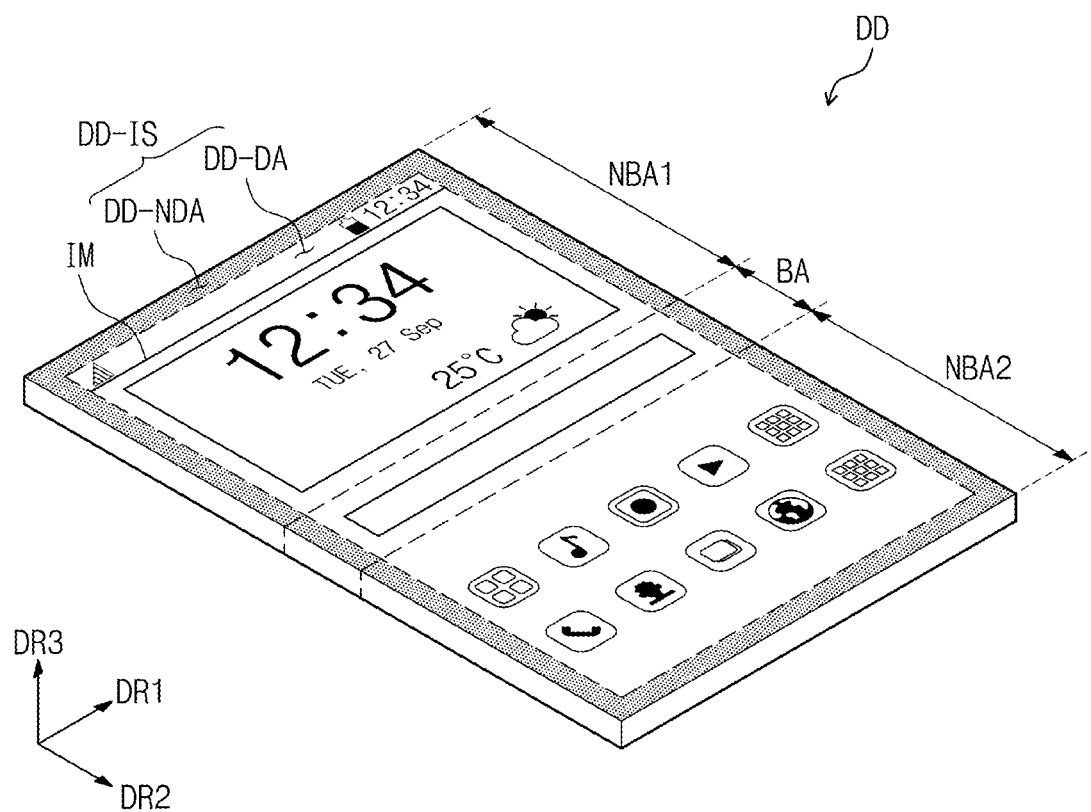
FIGS. 1A, 1B, and 1C are perspective views illustrating a display device according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "under," "lower," "above," "over," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
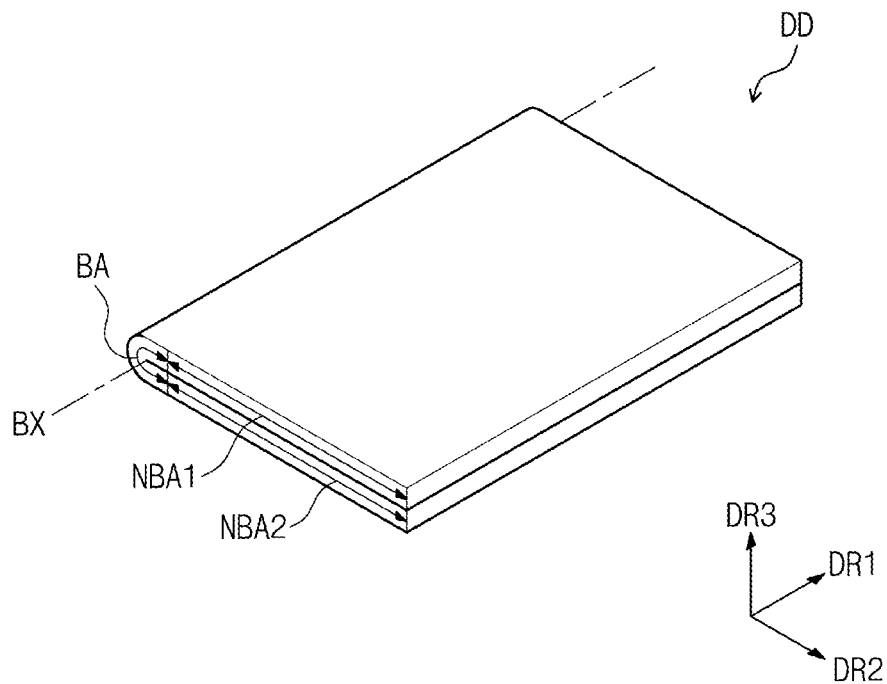
Figure 1C:
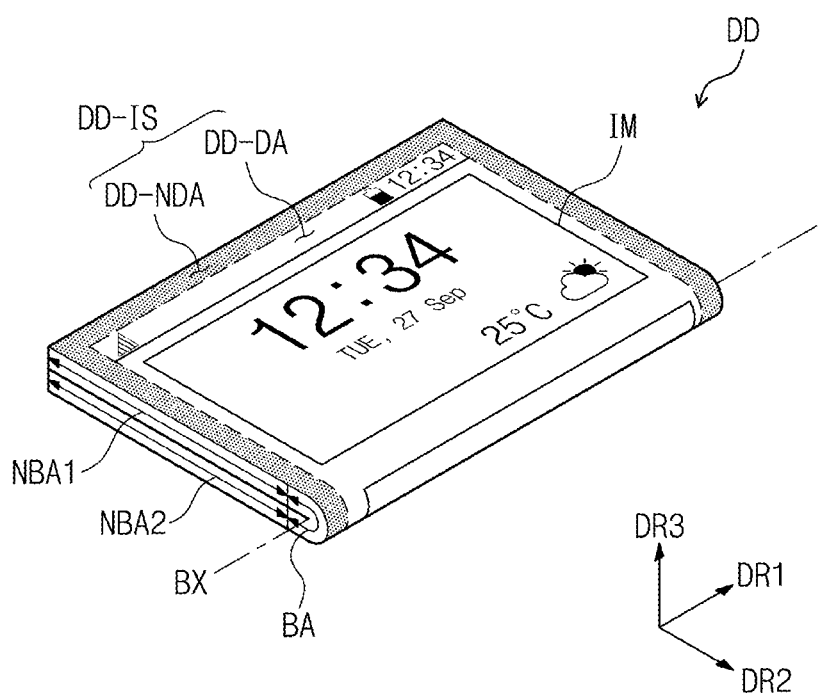

FIGS. 1A, 1B, and 1C are perspective views illustrating a display device DD according to an exemplary embodiment of the invention.

As illustrated in FIGS. 1A, 1B, and 1C, a display surface DD-IS of a display device DD is parallel to a plane defined by a first directional axis DR1 and a second directional axis DR2. A normal direction of the display surface DD-IS (i.e., a thickness direction of the display device DD) is indicated by a third directional axis DR3. A front surface (or a top surface) and a back surface (or a bottom surface) of each of the members are defined based on the third directional axis DR3. However, directions indicated by the first to third directional axes DR1, DR2 and DR3 may be relative concepts and may be changed into other directions. Hereinafter, first to third directions are the directions indicated by the first to third directional axes DR1, DR2 and DR3, respectively, and are indicated by the same reference designators as the first to third directional axes DR1, DR2 and DR3.

As illustrated in FIGS. 1A, 1i, and 1C, the display surface DD-IS includes a display area DD-DA, in which an image IM is displayed, and a non-display area DD-NDA adjacent to the display area DD-DA. An image is not displayed in the non-display area DD-NDA. Icon images are illustrated as an example of the image IM in FIGS. 1A, 1B, and 1C. For example, the display area DD-DA may have a quadrilateral shape (e.g., a rectangular shape). The non-display area DD-NDA may surround the display area DD-DA. However, exemplary embodiments of the invention are not limited thereto. The shapes of the display area DD-DA and the non-display area DD-NDA may be relatively designed.

As illustrated in FIGS. 1A, 1B, and 1C, the display device DD may include a plurality of areas defined according to an operation mode. The display device DD may include a bending area BA bendable on the basis of a bending axis BX, a first non-bending area NBA1, and a second non-bending area NBA2. The first and second non-bending areas NBA1 and NBA2 are not bent. As illustrated in FIG. 1B, the display device DD may be bent inwards such that the display surface DD-IS of the first non-bending area NBA1 faces the display surface DD-IS of the second non-bending area NBA2. As illustrated in FIG. 1C, the display device DD may be bent outwards such that the display surface DD-IS is exposed to the outside. The display device DD repeatedly bent and stretched as illustrated in FIGS. 1A, 1B, and 1C may be defined as a foldable display device.

In certain exemplary embodiments, the display device DD may include a plurality of bending areas BA. In addition, the bending area BA may be defined or designed to correspond to a manner in which a user operates the display device DD. For example, unlike FIGS. 1B and 1C, the bending area BA may be defined or designed to be parallel to the second directional axis DR2 or may be defined or designed in a diagonal direction. An area of the bending area BA may not be fixed but may be determined depending on to a radius of curvature. In an exemplary embodiment of the invention, the display device DD may be repeatedly operated only between the operation modes illustrated in FIGS. 1A and 1B.

The foldable display device DD is illustrated in the exemplary embodiment of the invention. However, exemplary embodiments of the invention are not limited thereto. In certain exemplary embodiments, the display device DD may include a curved display surface or may include a three-dimensional display surface (e.g., a polygonal pillar-shaped display surface) that includes a plurality of display areas indicating different directions from each other. In certain exemplary embodiments, the display device DD may be a flat rigid display device. In certain exemplary embodiments, the display device DD may be a bending type display device of which an edge area is bent.

In the present exemplary embodiment, the display device DD applied to a portable phone is illustrated. However, exemplary embodiments of the invention are not limited thereto. In certain exemplary embodiments, the display device DD may be applied to large-sized electronic devices (e.g., televisions and monitors) and small and middle-sized electronic devices (e.g., tablets, car navigation units, game consoles, and smart watches).

FIGS. 2A, 2B, 2C, 2D, 2E, and 2F are cross-sectional views illustrating display devices DD according to some exemplary embodiments of the invention. FIGS. 2A, 2B, 2C, 2D, 2E, and 2F illustrate cross sections defined by the second directional axis DR2 and the third directional axis DR3. FIGS. 2A, 2B, 2C, 2D, 2E, and 2F simply illustrate a functional panel and/or functional units of the display device DD to explain stacking relationship of the functional panel and/or the functional units.

The display device DD according to an exemplary embodiment of the invention may include a display panel, an input sensing unit, an anti-reflection unit, and a window unit. At least some of the display panel, the input sensing unit, the anti-reflection unit and the window unit may be integrally formed with each other by continuous processes or may be coupled to each other by an adhesive member. In FIGS. 2A, 2B, 2C, 2D, 2E, and 2F, a pressure sensitive adhesive film (PSA) is illustrated as an example of the adhesive member. However, exemplary embodiments of the invention are not limited thereto. In certain exemplary embodiments, the adhesive member described hereinafter may include a general adhesive. In an exemplary embodiment of the invention, the anti-reflection unit may be replaced with another component or may be omitted.

In FIGS. 2A to 2F, at least one of the input sensing unit, the anti-reflection unit, or the window unit, which is integrally formed with another component by continuous processes, is represented as "~layer". At least one of the input sensing unit, the anti-reflection unit, or the window unit, which is coupled to another component by an adhesive member, is represented as "~panel". The "panel" may include a base layer providing a base surface. For example, the base layer may be a synthetic resin film, a composite material film, or a glass substrate. The "layer" may not include the base layer. In other words, the unit represented as the "layer" is disposed on a base surface provided by another unit.

When the input sensing unit, the anti-reflection unit and the window unit include the base layers, they may be referred to as an input sensing panel ISP, an anti-reflection panel RPP, and a window panel WP. When the input sensing unit, the anti-reflection unit and the window unit do not include the base layers, they may be referred to as an input sensing layer ISL, an anti-reflection layer RPL, and a window layer WL.

Figure 2A:
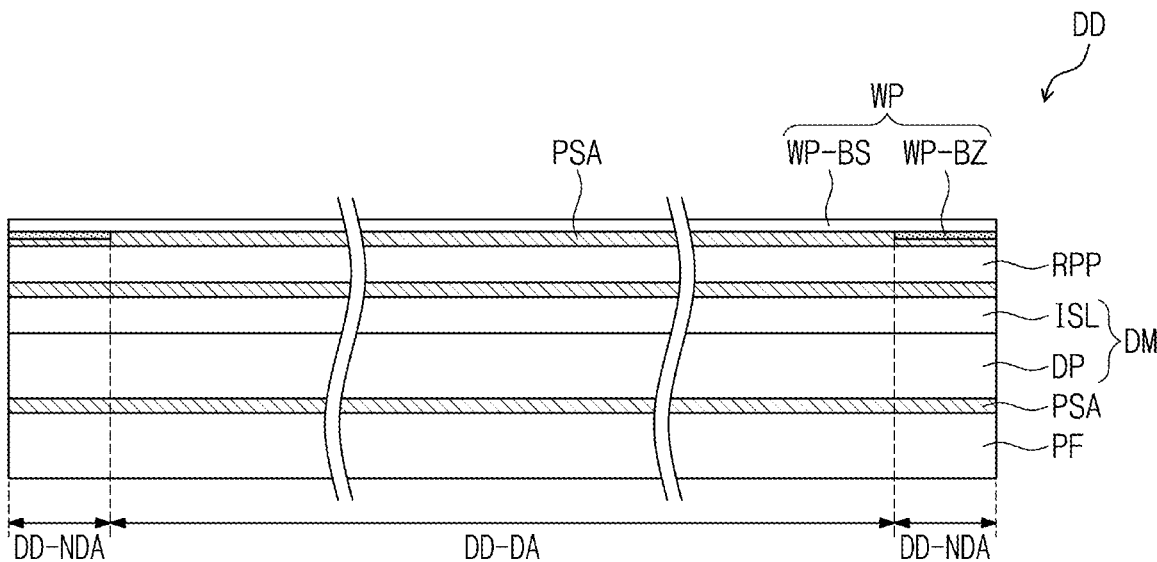
FIGS. 2A to 2F are cross-sectional views illustrating display devices according to some exemplary embodiments of the invention.
Figure 2A:
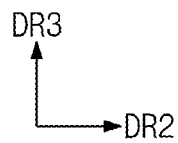

As illustrated in FIG. 2A, the display device DD may include a display panel DP, the input sensing layer ISL, the anti-reflection panel RPP, the window panel WP, and a protective member PF. The input sensing layer ISL is disposed directly on the display panel DP. In the present specification, it is understood that when a component B1 is disposed directly on a component A1, an additional adhesive member is not disposed between the component A1 and the component B1. In other words, the term "directly" means that there are no intervening components. After formation of the component A1, the component B1 is formed on a base surface, provided by the component A1, through continuous processes.

The display panel DP and the input sensing layer ISL disposed directly on the display panel DP may be defined as a display module DM. Pressure sensitive adhesive films PSA are disposed between the input sensing layer ISL and the anti-reflection panel RPP and between the anti-reflection panel RPP and the window panel WP, respectively.

The display panel DP generates an image and the input sensing layer ISL obtains coordinate information of an external input (e.g., a touch event). The protective member PF supports the display panel DP and protects the display panel DP from an external impact.

The protective member PF may include a plastic film as a base layer. The protective member PF may include a plastic film including a thermoplastic resin, for example, one selected from a group consisting of polyethylene terepthalate (PET), polyethylene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and any combination thereof. In particular, polyethyleneterepthalate (PET) has excellent heat resistance, excellent fatigue strength, and excellent electrical characteristics and is less affected by temperature and humidity.

The material of the protective member PF is not limited to the plastic resins but may include an organic/inorganic composite material. For example, the protective member PF may include a porous organic layer and an inorganic material filling pores of the porous organic layer.

The display panel DP according to an exemplary embodiment of the invention may be, but not limited to, a light emitting type display panel. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the display panel DP corresponding to the organic light emitting display panel will be described as an example.

The anti-reflection panel RPP reduces a reflectance of natural light (or the light of the sun) incident on the window panel WP. The anti-reflection panel RPP according to an exemplary embodiment of the invention may include a phase retarder and a polarizer. The phase retarder may be a film type or a liquid crystal coating type and may include a λ2 phase retarder and/or a λ/4 phase retarder. The polarizer may also be a film type or a liquid crystal coating type. The film type may include an extendable synthetic resin film, and the liquid crystal coating type may include arranged liquid crystals. The anti-reflection panel RPP may further include a protective film. The phase retarder and the polarizer may be defined as a base layer of the anti-reflection panel RPP, or the protective film may be defined as the base layer of the anti-reflection panel RPP.

The anti-reflection panel RPP according to an exemplary embodiment of the invention may include color filters. The color filters may be arranged in a predetermined form. The arrangement of the color filters may be determined in consideration of light emitting colors of pixels included in the display panel DP. The anti-reflection panel RPP may further include a black matrix adjacent to the color filters.

The window panel WP according to an exemplary embodiment of the invention includes a base layer WP-BS and a light shielding pattern WP-BZ. The base layer WP-BS may include a glass substrate and/or a synthetic resin film. The base layer WP-BS is not limited to a single layer. The base layer WP-BS may include two or more films coupled to each other by an adhesive member.

The light shielding pattern WP-BZ partially overlaps with the base layer WP-BS. The light shielding pattern WP-BZ may be disposed on a back surface of the base layer WP-BS to define a bezel area (i.e., the non-display area DD-NDA of FIG. 1) of the display device DD.

The light shielding pattern WP-BZ may be a colored organic layer and may be formed by, for example, a coating method. Even though not shown in the drawings, the window panel WP may further include a functional coating layer disposed on a front surface of the base layer WP-BS. The functional coating layer may include at least one of an anti-fingerprint layer, an anti-reflection layer, or a hard coating layer.

In FIGS. 2B, 2C, 2D, 2E, and 2F, the base layer WP-BS and the light shielding pattern WP-BZ are omitted in the window panel WP and the window layer WL for the purpose of ease and convenience in illustration.

Figure 2B:
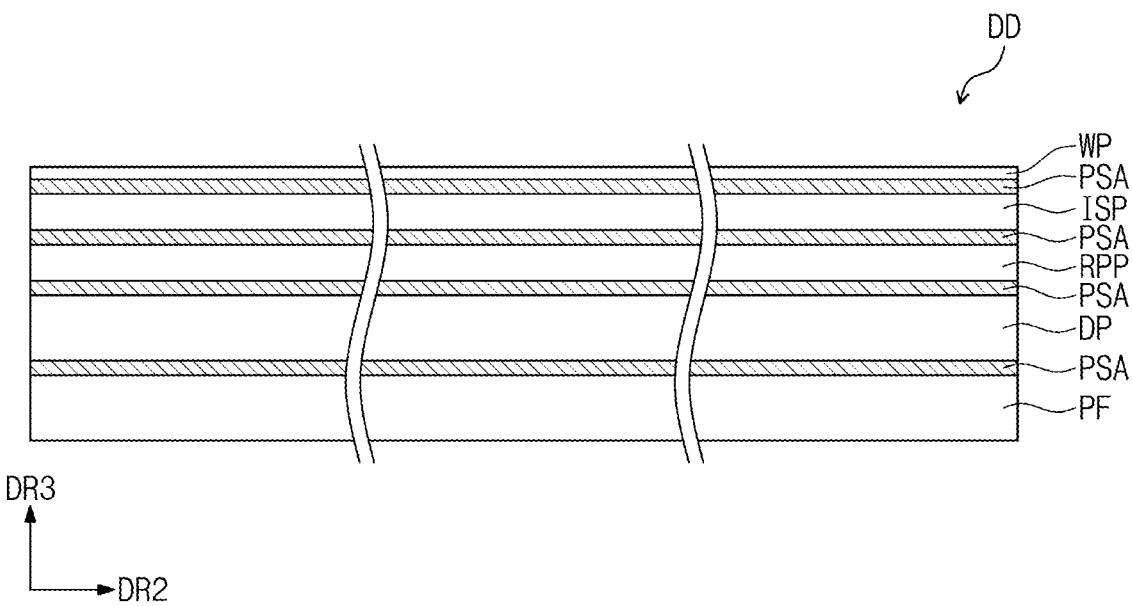
Figure 2B:
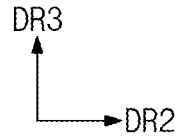
Figure 2C:
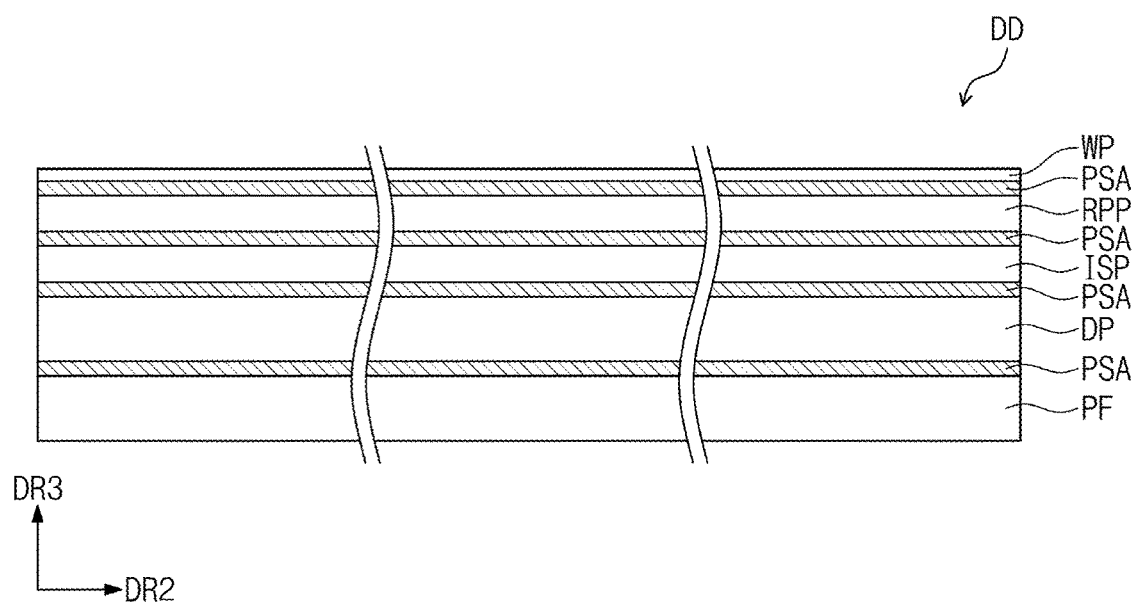

As illustrated in FIGS. 2B and 2C, the display device DD according to some exemplary embodiments may include the protective member PF, the display panel DP, the input sensing panel ISP, the anti-reflection panel RPP, and the window panel WP. A stacking order of the input sensing panel ISP and the anti-reflection panel RPP may be changed.

Figure 2D:
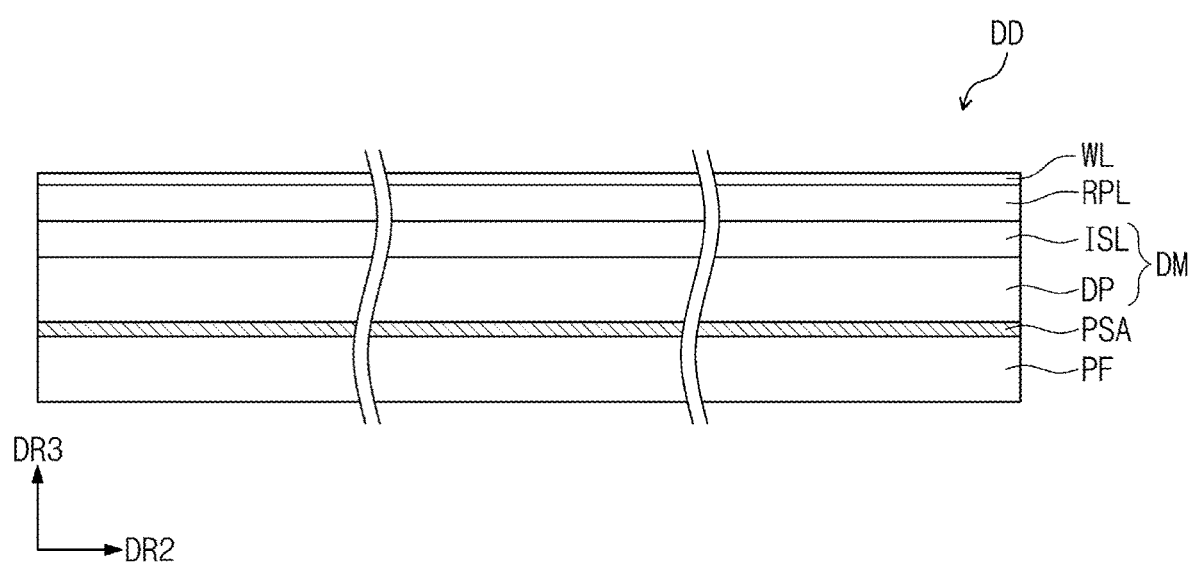

As illustrated in FIG. 2D, the display device DD according to an exemplary embodiment may include the protective member PF, the display panel DP, the input sensing layer ISL, the anti-reflection layer RPL, and the window layer WL. Adhesive members may be omitted from the display device DD, and the input sensing layer ISL, the anti-reflection layer RPL and the window layer WL may be sequentially formed on a base surface provided by the display panel DP through continuous processes. A stacking order of the input sensing layer ISL and the anti-reflection layer RPL may be changed.

In this case, the anti-reflection layer RPL may include a liquid crystal coating type phase retarder and a liquid crystal coating type polarizer. The phase retarder and the polarizer may include discotic liquid crystal layers, each of which has a tilt angle in one direction.

Figure 2E:
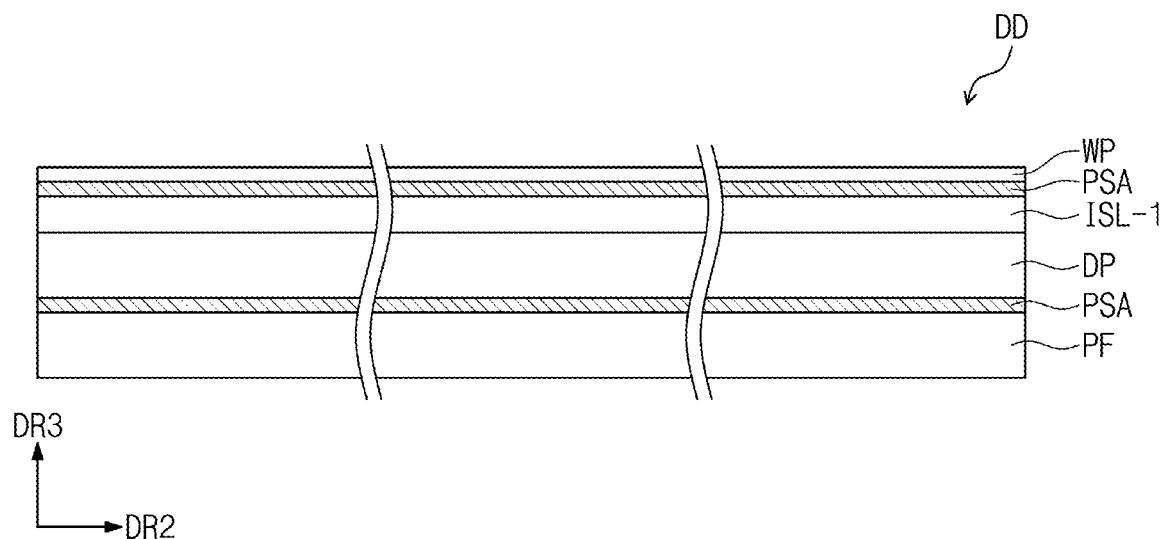
Figure 2F:
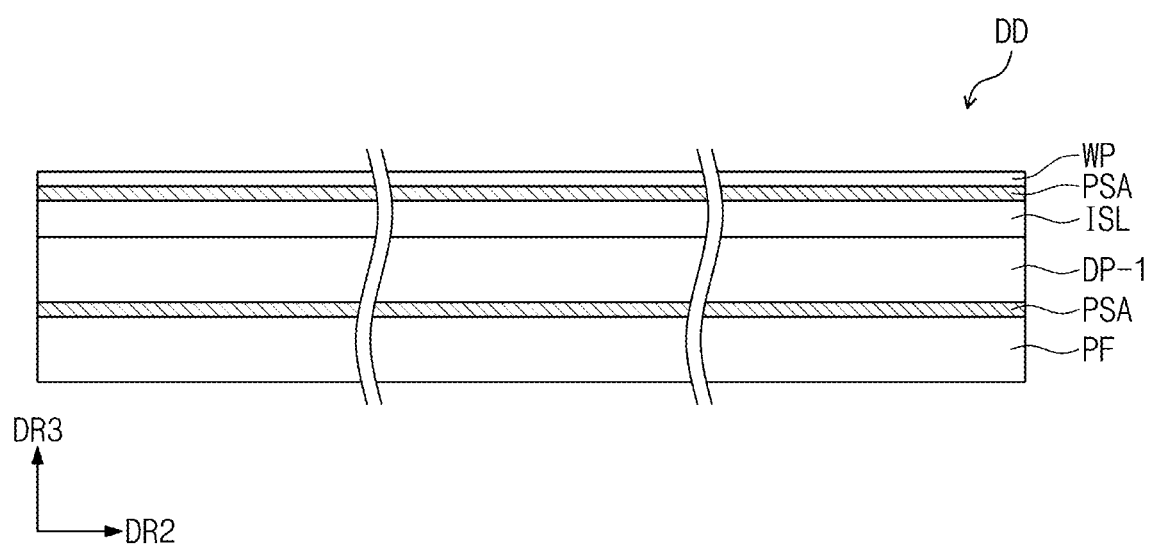

As illustrated in FIGS. 2E and 2F, the display device DD according to some exemplary embodiments may not include the anti-reflection unit. Unlike the input sensing panel ISP or the input sensing layer ISL of FIGS. 2A to 2D, an input sensing layer ISL-1 of FIG. 2E may further include a color filter having an anti-reflection function. Unlike the display panel DP of FIGS. 2A to 2D, a display panel DP-1 of FIG. 2F may further include a color filter having an anti-reflection function.

Figure 3:
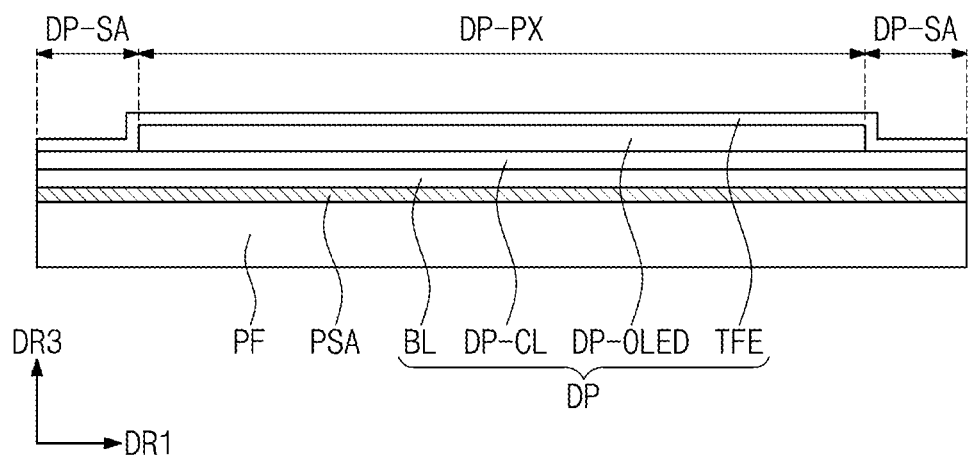
FIG. 3 is a cross-sectional view illustrating a display panel according to an exemplary embodiment.
Figure 4:
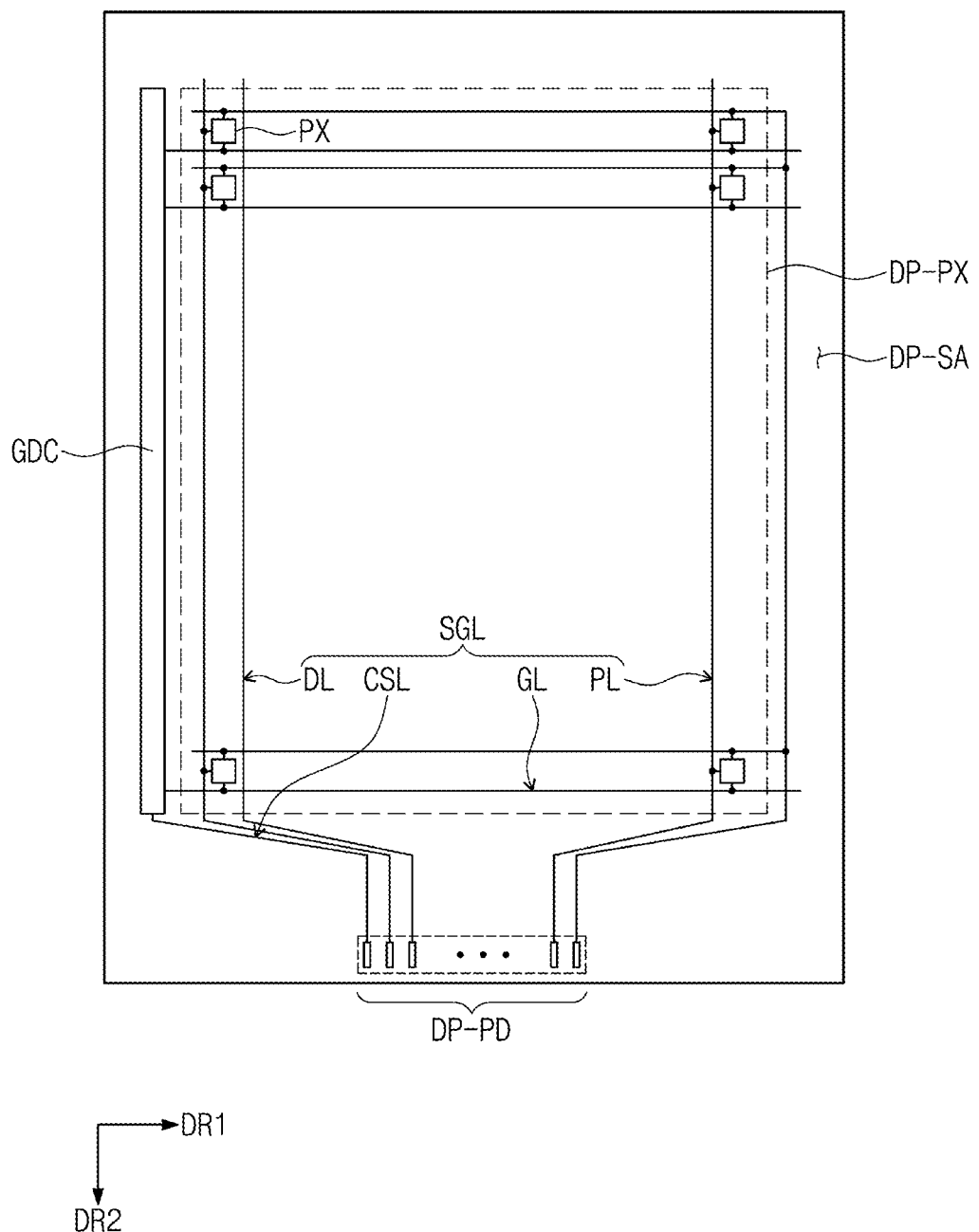
FIG. 4 is a plan view illustrating a display panel according to an exemplary embodiment.
Figure 5:
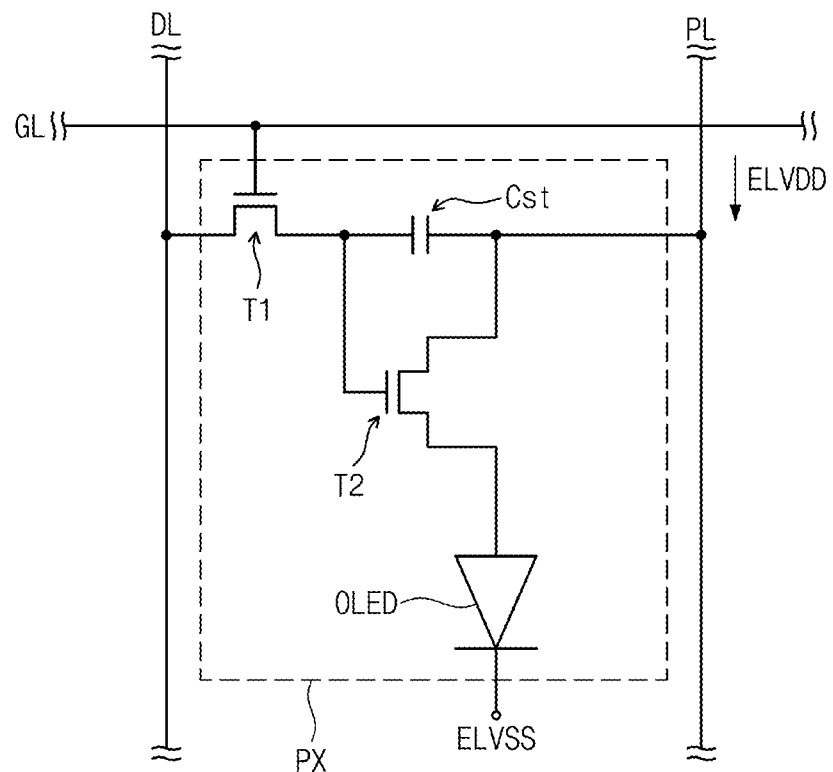
FIG. 5 is an equivalent circuit diagram of a pixel according to an exemplary embodiment.
Figure 6:
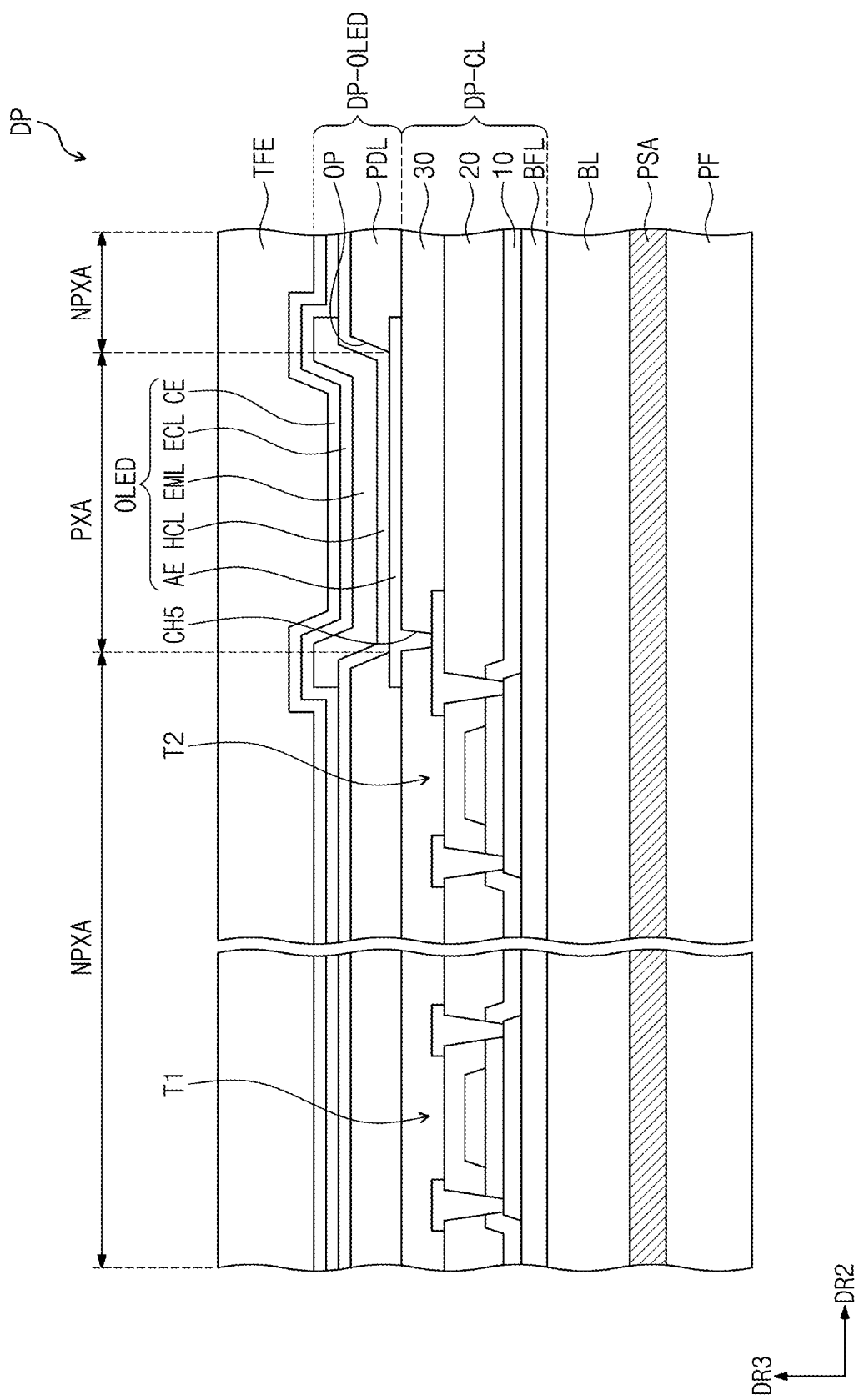
FIG. 6 is a cross-sectional view illustrating a portion of a display panel corresponding to the equivalent circuit illustrated in FIGS. 4 and 5.

FIG. 3 is a cross-sectional view illustrating a display panel DP according to an exemplary embodiment of the invention. FIG. 4 is a plan view illustrating the display panel DP according to an exemplary embodiment of the invention. FIG. 5 is an equivalent circuit diagram of a pixel PX according to an exemplary embodiment of the invention. FIG. 6 is a cross-sectional view illustrating a portion of the display panel DP corresponding to the equivalent circuit illustrated in FIGS. 4 and 5. The display panel DP described hereinafter may be applied to all of the display devices DD described with reference to FIGS. 2A to 2F. The protective member PF disposed on a back surface of the display panel DP is also illustrated in FIG. 3.

As illustrated in FIG. 3, the display panel DP includes a base layer BL, a circuit element layer DP-CL, a display element layer DP-OLED, and a thin film encapsulation layer TFE. The circuit element layer DP-CL, the display element layer DP-OLED and the thin film encapsulation layer TFL may be disposed on the base layer BL. Even though not shown in the drawings, the display panel DP may further include functional layers such as a buffer layer and a refractive index adjusting layer.

The base layer BL may include a synthetic resin film. A synthetic resin layer is formed on a work substrate used when the display panel DP is manufactured. Thereafter, a conductive layer and an insulating layer are formed on the synthetic resin layer. When the work substrate is removed, the synthetic resin layer corresponds to the base layer BL. The synthetic resin layer may include a thermosetting resin. In particular, the synthetic resin layer may be a polyimide-based resin layer. However, exemplary embodiments of the invention are not limited to a kind of the material of the synthetic resin layer. In other exemplary embodiments, the base layer BL may include a glass substrate, a metal substrate, or an organic/inorganic composite material substrate.

The circuit element layer DP-CL includes at least one insulating layer and a circuit element. Hereinafter, the insulating layer included in the circuit element layer DP-CL is referred to as an intermediate insulating layer. The intermediate insulating layer may include at least one intermediate inorganic layer and/or at least one intermediate organic layer. The circuit element includes a signal line and a driving circuit of a pixel. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

The display element layer DP-OLED includes a light emitting element. The display element layer DP-OLED may include organic light emitting diodes. The display element layer DP-OLED may further include an organic layer such as a pixel defining layer.

The thin film encapsulation layer TFE encapsulates the display element layer DP-OLED. The thin film encapsulation layer TFE includes at least one insulating layer. The thin film encapsulation layer TFE according to an exemplary embodiment of the invention may include at least one inorganic layer (hereinafter, referred to as an encapsulation inorganic layer). The thin film encapsulation layer TFE according to an exemplary embodiment of the invention may include at least one organic layer (hereinafter, referred to as an encapsulation organic layer) and at least one encapsulation inorganic layer.

The encapsulation inorganic layer protects the display element layer DP-OLED from water/oxygen, and the encapsulation organic layer protects the display element layer DP-OLED from a foreign material such as dust particles. The encapsulation inorganic layer may include at least one of, but not limited to, a silicon nitride layer, a silicon oxynitride layer, a silicon oxide layer, a titanium oxide layer, or an aluminum oxide layer. The encapsulation organic layer may include, but not limited to, an acrylic-based organic layer.

In an exemplary embodiment of the invention, the thin film encapsulation layer TFE may be omitted. An encapsulation substrate such as a glass substrate may be substituted for the thin film encapsulation layer TFE. The encapsulation substrate may be coupled to the display panel DP by a sealant. The sealant disposed in a peripheral area DP-SA may couple the encapsulation substrate (e.g., the glass substrate) directly to the circuit element layer DP-CL.

As illustrated in FIG. 4, the display panel DP may include a driving circuit GDC, a plurality of signal lines SGL, a plurality of signal pads DP-PD, and a plurality of pixels PX. Each of the pixels PX includes an organic light emitting diode and a pixel driving circuit connected to the organic light emitting diode. The driving circuit GDC, the signal lines SGL, the signal pads DP-PD and the pixel driving circuit may be included in the circuit element layer DP-CL illustrated in FIG. 3.

The pixels PX may be divided into a plurality of groups on the basis of colors of lights emitted from the pixels PX. For example, the pixels PX may include red pixels, green pixels, and blue pixels. The pixels PX may further include white pixels. The pixels of different groups may include organic light emitting layers of different materials from each other or may include color filters of different colors from each other.

As illustrated in FIG. 4, the driving circuit GDC may include a scan driving circuit. The scan driving circuit generates a plurality of scan signals and sequentially outputs the scan signals to a plurality of scan lines GL to be described below. The scan driving circuit may further output other control signals to the pixel driving circuits of the pixels PX.

The scan driving circuit may include a plurality of thin film transistors formed by the same process (e.g., a low-temperature polycrystalline silicon (LTPS) process or a low-temperature polycrystalline oxide (LTPO) process) as the pixel driving circuits of the pixels PX.

The display panel DP may include a pixel area DP-PX and the peripheral area DP-SA when viewed in a plan view. The pixel area DP-PX may be an area in which the pixels PX are disposed, and the peripheral area DP-SA may be an area in which the pixels PX are not disposed.

In the present exemplary embodiment, the peripheral area DP-SA may be defined along a border of the pixel area DP-PX. The pixel area DP-PX may be wider than the display area DD-DA illustrated in FIG. 1, and the peripheral area DP-SA may be narrower than the non-display area DD-NDA illustrated in FIG. 1. The driving circuit GDC, the signal pads DP-PD and a portion of the signal lines are disposed in the peripheral area DP-SA.

FIG. 5 illustrates one scan line GL, one data line DL, a power line PL, and the pixel connected thereto. The pixel PX includes a first transistor (or a switching transistor) T1, a second transistor (or a driving transistor) T2 and a capacitor Cst which constitute the pixel driving circuit for driving an organic light emitting diode OLED. A first power source voltage ELVDD is provided to the second transistor T2, and a second power source voltage ELVSS is provided to the organic light emitting diode OLED. The second power source voltage ELVSS may be lower than the first power source voltage ELVDD. The organic light emitting diode OLED may be a front surface type light emitting diode or a back surface type light emitting diode.

The equivalent circuit is illustrated as an example of the pixel PX, and exemplary embodiments of the invention are not limited thereto. The pixel PX may further include a plurality of transistors and/or may include two or more capacitors. In another exemplary embodiment, the organic light emitting diode OLED may be connected between the power line PL and the second transistor T2.

FIG. 6 illustrates a partial cross section of the display panel DP corresponding to the equivalent circuit illustrated in FIGS. 4 and 5.

The circuit element layer DP-CL, the display element layer DP-OLED and the thin film encapsulation layer TFE are sequentially stacked on the base layer BL. In the present exemplary embodiment, the circuit element layer DP-CL may include a buffer layer BFL corresponding to an inorganic layer, a first intermediate inorganic layer 10, a second intermediate inorganic layer 20, and an intermediate organic layer 30. Materials of the inorganic layers and the organic layer are not limited to specific materials, and the buffer layer BFL may be disposed or omitted in some exemplary embodiments of the invention.

The display element layer DP-OLED is disposed on the intermediate organic layer 30. The display element layer DP-OLED may include a pixel defining layer PDL and an organic light emitting diode OLED. The pixel defining layer PDL may include an organic material. A first electrode AE is disposed on the intermediate organic layer 30. An opening OP is defined in the pixel defining layer PDL. The opening OP of the pixel defining layer PDL exposes at least a portion of the first electrode AE. In an exemplary embodiment of the invention, the pixel defining layer PDL may be omitted.

The pixel area DP may include a light emitting area PXA and a non-light emitting area NPXA adjacent to the light emitting area PXA. The non-light emitting area NPXA may surround the light emitting area PXA. In the present exemplary embodiment, the light emitting area PXA is defined to correspond to a partial area of the first electrode AE, which is exposed through the opening OP.

The organic light emitting diode OLED may include the first electrode AE, a hole control layer HCL, a light emitting layer EML, an electron control layer ECL, and a second electrode CE. However, the stack structure of the organic light emitting diode OLED is not limited thereto but may be variously modified.

The hole control layer HCL, the electron control layer ECL and the second electrode CE may be disposed in both the light emitting area PXA and the non-light emitting area NPXA. Even though not shown in the drawings, these common layers may be formed in the pixels PX (see FIGS. 4 and 5). The light emitting layer EML may have a multi-layered structure which is called 'a tandem'.

The thin film encapsulation layer TFE is disposed on the second electrode CE. The thin film encapsulation layer TFE is disposed in common in the pixels PX. In the present exemplary embodiment, the thin film encapsulation layer TFE directly covers the second electrode CE. In an exemplary embodiment of the invention, a capping layer covering the second electrode CE may further be disposed between the thin film encapsulation layer TFE and the second electrode CE. In this case, the thin film encapsulation layer TFE may directly cover the capping layer.

In an exemplary embodiment of the invention, the organic light emitting diode OLED may further include a resonance structure for controlling a resonance distance of light generated from the light emitting layer EML. The resonance structure may be disposed between the first electrode AE and the second electrode CE, and a thickness of the resonance structure may be determined depending on a wavelength of the light generated from the light emitting layer EML.

Figure 7:
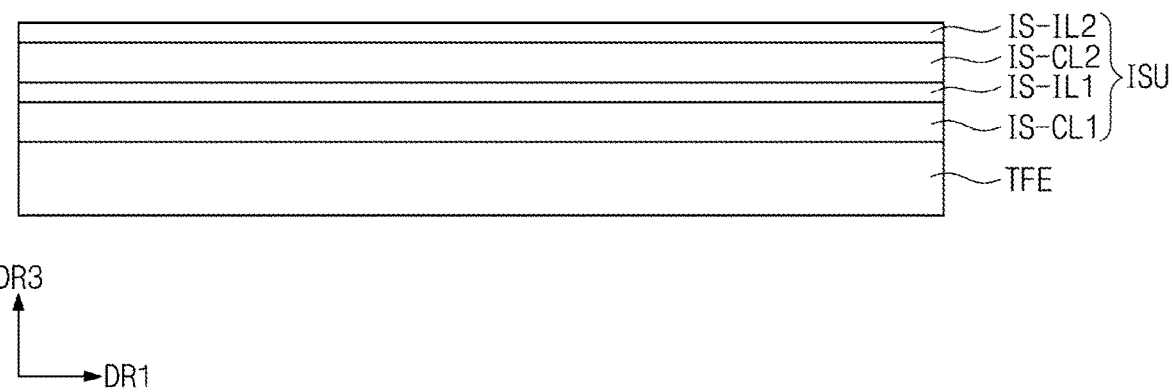
FIG. 7 is a cross-sectional view illustrating an input sensing unit according to an exemplary embodiment.
Figure 8:
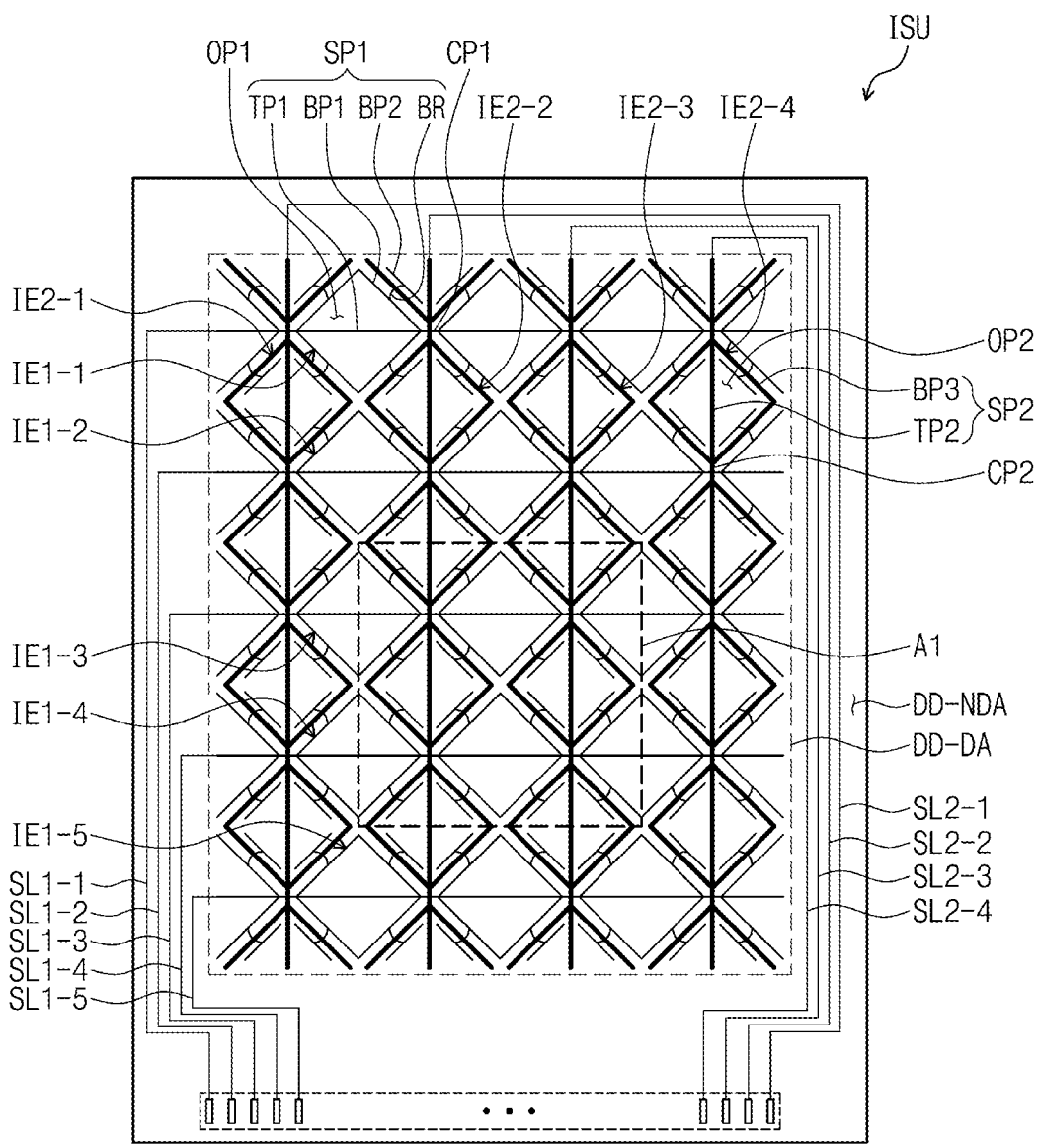
FIG. 8 is a plan view illustrating an input sensing unit according to an exemplary embodiment.
Figure 8:
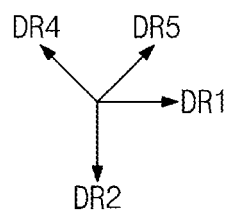
Figure 9:
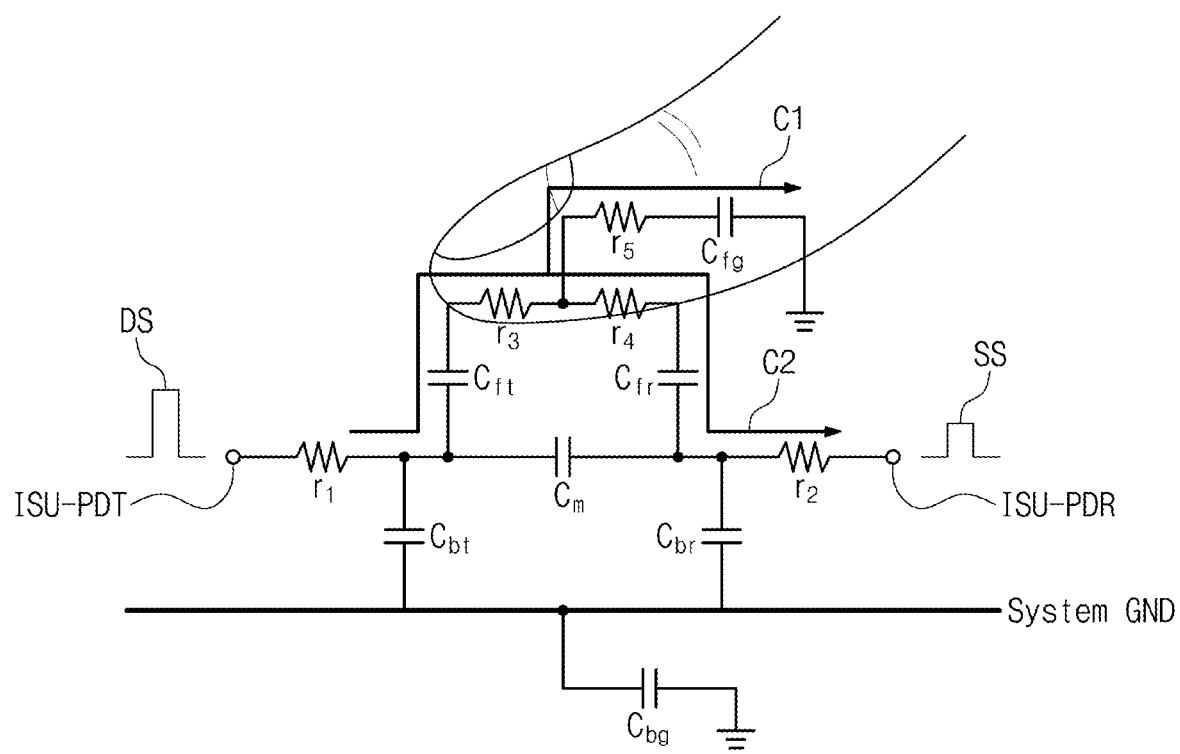
FIG. 9 is an equivalent circuit diagram of an input sensing unit in a state in which a touch event occurs.

FIG. 7 is a cross-sectional view illustrating an input sensing unit ISU according to an exemplary embodiment of the invention. FIG. 8 is a plan view illustrating the input sensing unit ISU according to an exemplary embodiment of the invention. FIG. 9 is an equivalent circuit diagram of the input sensing unit ISU in a state in which a touch event occurs.

FIGS. 7, 8, and 9 illustrate the "layer" type input sensing unit described with reference to FIGS. 2A, 2B, 2C, 2D, 2E, and 2F as an example. The thin film encapsulation layer TFE providing a base surface is additionally illustrated in FIG. 7.

The input sensing unit ISU may have a multi-layered structure in each of the "layer" type and the "panel" type. The input sensing unit ISU includes a sensing electrode, a signal line connected to the sensing electrode, and at least one insulating layer. The input sensing unit ISU may sense an external input by, for example, a capacitive method.

As illustrated in FIG. 7, the input sensing unit ISU according to an exemplary embodiment of the invention may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layered structure or may have a multi-layered structure including a plurality of layers stacked along the third direction DR3. The conductive layer of the single-layered structure may include a metal layer or a transparent conductive layer. The metal layer may include molybdenum, silver, titanium, copper, aluminum, or any alloy thereof. The transparent conductive layer may include a transparent conductive oxide such as indium tin oxide (ITO), indium zinc oxide (IZO), zinc oxide (ZnO), or indium tin zinc oxide (ITZO). Alternatively, the transparent conductive layer may include a conductive polymer (e.g., PEDOT), a metal nanowire, and/or graphene.

The conductive layer of the multi-layered structure may include a plurality of metal layers. For example, the plurality of metal layers may have a three-layer structure of titanium/aluminum/titanium. In certain exemplary embodiments, the conductive layer of the multi-layered structure may include at least one metal layer and at least one transparent conductive layer.

Each of the first and second conductive layers IS-CL1 and IS-CL2 includes a plurality of patterns. The first conductive layer IS-CL1 includes first conductive patterns, and the second conductive layer IS-CL2 includes second conductive patterns. The first conductive patterns may include sensing electrodes and signal lines, and the second conductive patterns may include sensing electrodes and signal lines.

A stack structure and a material of the sensing electrodes may be determined in consideration of sensing sensitivity. RC delay may affect the sensing sensitivity. Since a resistance of the metal layer is less than a resistance of the transparent conductive layer, a RC value of the sensing electrodes including the metal layer is reduced. Thus, a charging time of a capacitor defined between the sensing electrodes is reduced. The sensing electrodes including the transparent conductive layer may not be visible to a user, as compared with the metal layer. In addition, the sensing electrodes including the transparent conductive layer may increase an input area to increase a capacitance.

The sensing electrodes including the metal layer may have a mesh shape to prevent the sensing electrodes from being visible to a user. Meanwhile, a thickness of the thin film encapsulation layer TFE may be adjusted such that noise occurring by the components of the display element layer DP-OLED does not affect the input sensing unit ISU. Each of the first and second insulating layers IS-IL1 and IS-IL2 may have a single-layered or multi-layered structure. Each of the first and second insulating layers IS-IL1 and IS-IL2 may include an inorganic material, an organic material, or a composite material.

At least one of the first insulating layer IS-IL1 or the second insulating layer IS-IL2 may include an inorganic layer. The inorganic layer may include at least one of aluminum oxide, titanium oxide, silicon oxide, silicon oxynitride, zirconium oxide, or hafnium oxide.

At least one of the first insulating layer IS-IL1 or the second insulating layer IS-IL2 may include an organic layer. The organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

In FIG. 7, the first insulating layer IS-IL1 completely overlapping with the thin film encapsulation layer TFE is illustrated as an example. Alternatively, the first insulating layer IS-IL1 may include a plurality of insulating patterns spaced apart from each other. The insulating patterns may be disposed between the first conductive patterns and the second conductive patterns in intersection areas of the first conductive patterns and the second conductive patterns to insulate the first conductive patterns from the second conductive patterns.

As illustrated in FIG. 8, the input sensing unit ISU may include first sensing electrodes IE1-1, IE1-2, IE1-3, IE1-4, and IE1-5, first signal lines SL1-1, SL1-2, SL1-3, SL1-4, and SL1-5 connected to the first sensing electrodes IE1-1 to IE1-5, second sensing electrodes IE2-1, IE2-2, IE2-3, and IE2-4, and second signal lines SL2-1, SL2-2, SL2-3, and SL2-4 connected to the second sensing electrodes IE2-1 to IE2-4.

The first sensing electrodes IE1-1 to IE1-5 intersect the second sensing electrodes IE2-1 to IE2-4. Each of the first sensing electrodes IE1-1 to IE1-5 has a shape extending in the first direction DR1, and the first sensing electrodes IE1-1 to IE1-5 are arranged in the second direction DR2. Each of the second sensing electrodes IE2-1 to IE2-4 has a shape extending in the second direction DR2, and the second sensing electrodes IE2-1 to IE2-4 are arranged in the first direction DR1. An external input may be sensed by a mutual capacitance method. Alternatively, coordinates of the external input may be calculated during a first period by the mutual capacitance method, and then, the coordinates of the external input may be re-calculated during a second period by a self-capacitance method.

Each of the first sensing electrodes IE1-1 to IE1-5 includes first sensor parts SP1 and first connection parts CP1. The first sensor parts SP1 are arranged in the first direction DR1. Each of the first connection parts CP1 connects two of the adjacent first sensor parts SP1 to each other. Each of the second sensing electrodes IE2-1 to IE2-4 includes second sensor parts SP2 and second connection parts CP2. The second sensor parts SP2 are arranged in the second direction DR2. Each of the second connection parts CP2 connects two of the adjacent second sensor parts SP2 to each other.

Each of the first sensor parts SP1 includes a first trunk portion TP1, a first branch portion BP1, a second branch portion BP2, and a bridge BR. The first trunk portion TP1 extends in the first direction DR1. The first branch portion BP1 is connected to the first trunk portion TP1 and extends in a direction different from the first direction DR1 and the second direction DR2. The second branch portion BP2 is spaced apart from the first branch portion BP1.

Each of the first sensor parts SP1 may include a plurality of the first branch portions BP1, and one or some of the first branch portions BP1 may extend in another direction. FIG. 8 illustrates the first sensor parts SP1, each of which includes two first branch portions BP1 extending in a fourth direction DR4 and two first branch portions BP1 extending in a fifth direction DR5, as an example.

In FIG. 8, two first branch portions BP1 disposed on the first trunk portion TP1 may be connected to each other and may be connected to one end area and another end area of the first trunk portion TP1, respectively. The two first branch portions BP1 and the first trunk portion TP1 connected to each other may define a first opening OP1.

Here, a length of the first trunk portion TP1 may be defined as a distance between two intersection areas, adjacent in the first direction DR1, of the first sensing electrodes and the second sensing electrodes. The one end area of the first trunk portion TP1 may be defined as an area corresponding to a range from one of the two intersection areas to 30% of the length of the first trunk portion TP1, and the another end area of the first trunk portion TP1 may be defined as an area corresponding to a range from the other of the two intersection areas to 30% of the length of the first trunk portion TP1.

In FIG. 8, two first branch portions BP1 disposed under the first trunk portion TP1 are connected to each other. The two first branch portions BP1 may be connected to the one end area and the another end area of the first trunk portion TP1, respectively, to define the first opening OP1 under the first trunk portion TP1. Each of the first sensor parts SP1 may have a symmetrical shape with respect to the first trunk portion TP1.

Each of the first sensor parts SP1 may include a plurality of the second branch portions BP2. A corresponding one of the second branch portions BP2 and a corresponding one of the first branch portions BP1 may constitute a pair. The first branch portion BP1 and the second branch portion BP2 which constitute the pair may be electrically connected to each other. The bridge BR may connect the first branch portion BP1 and the second branch portion BP2 which constitute the pair. Each of the first sensor parts SP1 may include four bridges BR.

Each of the second sensor parts SP2 may include a second trunk portion TP2 and a third branch portion BP3. The second trunk portion TP2 extends in the second direction DR2. The third branch portion BP3 is connected to the second trunk portion TP2 and extends in a direction different from the first direction DR1 and the second direction DR2. The third branch portion BP3 may be disposed between the first branch portion BP1 and the second branch portion BP2 which constitute the pair.

Each of the second sensor parts SP2 may include a plurality of the third branch portions BP3, and one or some of the third branch portions BP3 may extend in another direction. FIG. 8 illustrates the second sensor parts SP2, each of which includes two third branch portions BP3 extending in the fourth direction DR4 and two third branch portions BP3 extending in the fifth direction DR5, as an example.

In FIG. 8, two third branch portions BP3 disposed at a left side of the second trunk portion TP2 may be connected to each other and may be connected to one end area and another end area of the second trunk portion TP2, respectively. The two third branch portions BP3 and the second trunk portion TP2 connected to each other may define a second opening OP2.

Here, a length of the second trunk portion TP2 may be defined as a distance between two intersection areas, adjacent in the second direction DR2, of the first sensing electrodes and the second sensing electrodes. The one end area of the second trunk portion TP2 may be defined as an area corresponding to a range from one of the two intersection areas to 30% of the length of the second trunk portion TP2, and the another end area of the second trunk portion TP2 may be defined as an area corresponding to a range from the other of the two intersection areas to 30% of the length of the second trunk portion TP2.

In FIG. 8, two third branch portions BP3 disposed at a right side of the second trunk portion TP2 are connected to each other. The two third branch portions BP3 may be connected to the one end area and the another end area of the second trunk portion TP2, respectively, to define the second opening OP2 at the right side of the second trunk portion TP2. Each of the second sensor parts SP2 may have a symmetrical shape with respect to the second trunk portion TP2.

Sizes of two first sensor parts SP1 disposed at both ends of each of the first sensing electrodes IE1-1, IE1-2, IE1-3, IE1-4, and IE1-5 may be smaller than a size of a first sensor part SP1 disposed at a center of each of the first sensing electrodes IE1-1 to IE1-5. For example, the sizes of the two first sensor parts SP1 disposed at the both ends may be equal to a half of the size of the first sensor part SP1 disposed at the center. Sizes of two second sensor parts SP2 disposed at both ends of each of the second sensing electrodes IE2-1, IE2-2, IE2-3, and IE2-4 may be smaller than a size of a second sensor part SP2 disposed at a center of each of the second sensing electrodes IE2-1 to IE2-4. For example, the sizes of the two second sensor parts SP2 disposed at the both ends may be equal to a half of the size of the second sensor part SP2 disposed at the center.

When a touch event occurs, a mutual capacitance $C_m$ defined between the first sensing electrode and the second sensing electrode of a corresponding spot is varied. Referring to FIG. 9, since the touch event occurs, a capacitance (hereinafter, referred to as a touch capacitance) is formed between both terminals of the mutual capacitance $C_m$. The touch capacitance may include two capacitances $C_{ft}$ and $C_{fr}$ connected in series.

One $C_{ft}$ of the touch capacitances $C_{ft}$ and $C_{fr}$ is formed between an input means (e.g., a finger) and one, to which a detection signal DS is applied, of the first sensing electrode and the second sensing electrode; the other $C_{fr}$ of the touch capacitances $C_{ft}$ and $C_{fr}$ is formed between the input means and the other of the first sensing electrode and the second sensing electrode. A microprocessor may read out a sensing signal SS from the other sensing electrode and may measure a variation ($\Delta C_m$) in capacitance between before and after the input means is inputted, from the sensing signal SS. The variation ($\Delta C_m$) in capacitance may be measured by sensing a variation in current of the sensing signal SS.

FIG. 9 additionally illustrates capacitances $C_{bt}$ and $C_{br}$ between a system ground GND and the first and second sensing electrodes, a capacitance $C_{bg}$ between the system ground GND and the ground, and a capacitance $C_{fg}$ between the input means and the ground. The system ground GND may be the second electrode CE illustrated in FIG. 6 or a voltage level corresponding to the second electrode CE. In addition, FIG. 9 also illustrates an equivalent resistance $r_1$ between an input pad ISU-PDT and the sensing electrode to which the detection signal DS is applied, an equivalent resistance $r_2$ between an output pad ISU-PDR and the other sensing electrode, and equivalent resistances $r_3$, $r_4$ and $r_5$ formed by the input means.

Referring to FIG. 2A, the touch capacitance $C_{ft}$ and $C_{fr}$ increases as a distance between a top surface of the input sensing unit ISU and a top surface of the window panel WP decreases. The distance between the top surface of the input sensing unit ISU and the top surface of the window panel WP may be 0.5 mm or less, in particular, 0.2 mm or less to improve folding characteristics of the foldable display device.

As the distance between the top surface of the input sensing unit ISU and the top surface of the window panel WP decreases, movement of a signal along a first path C1 of FIG. 9 decreases and movement of a signal along a second path C2 of FIG. 9 increases.

According to the input sensing unit ISU illustrated in FIG. 8, the third branch portion BP3 is disposed between the first branch portion BP1 and the second branch portion BP2 which constitute the pair, and thus a facing area between the first sensing electrode and the second sensing electrode increases. As a result, the mutual capacitance Cm may increase. Since the first openings OP1 and the second openings OP2 are defined in the first sensor parts SP1 and the second sensor parts SP2, overlapping areas between the input means and the first sensor parts SP1 are reduced and overlapping areas between the input means and the second sensor parts SP2 are reduced. Thus, the touch capacitance $C_{ft}$ and $C_{fr}$ may be reduced. As a result, the variation ($\Delta C_m$) in capacitance between before and after the inputting of the input means may increase.

In addition, the first trunk portion TP1 and the second trunk portion TP2 may prevent current paths from increasing by the openings OP1 and OP2. Furthermore, since the first openings OP1 and the second openings OP2 are defined in the first sensor parts SP1 and the second sensor parts SP2, overlapping areas between the system ground GND and the sensor parts SP1 and SP2 are reduced. Thus, the input sensing unit ISU may be less affected by a variation of the system ground.

In an aspect of the invention, each of the first and second sensing electrodes IE1-1 to IE1-5 and IE2-1 to IE2-4 may be defined by the following description. Referring to one first sensing electrode IE1-1, the first connection parts CP1 and the first trunk portions TP1 of the first sensor parts SP1 may be defined as a first extension. The first branch portions BP1 may be defined as first diagonal portions that are connected to the first extension in the intersection areas. The second branch portions BP2 which form the pairs with the first diagonal portions may be defined as second diagonal portions.

Referring to one second sensing electrode IE2-2, the second connection parts CP2 and the second trunk portions TP2 of the second sensor parts SP2 may be defined as a second extension. The third branch portions BP3 may be defined as third diagonal portions that are connected to the second extension in the intersection areas.

In an aspect of the invention, two first branch portions BP1 connected to each other may be defined as one branch portion, and two third branch portions BP3 connected to each other may be defined as one branch portion. In addition, four first branch portions BP1 may be defined as a rim portion defining one closed loop, and four third branch portions BP3 may also be defined as a rim portion defining one closed loop.

Figure 10A:
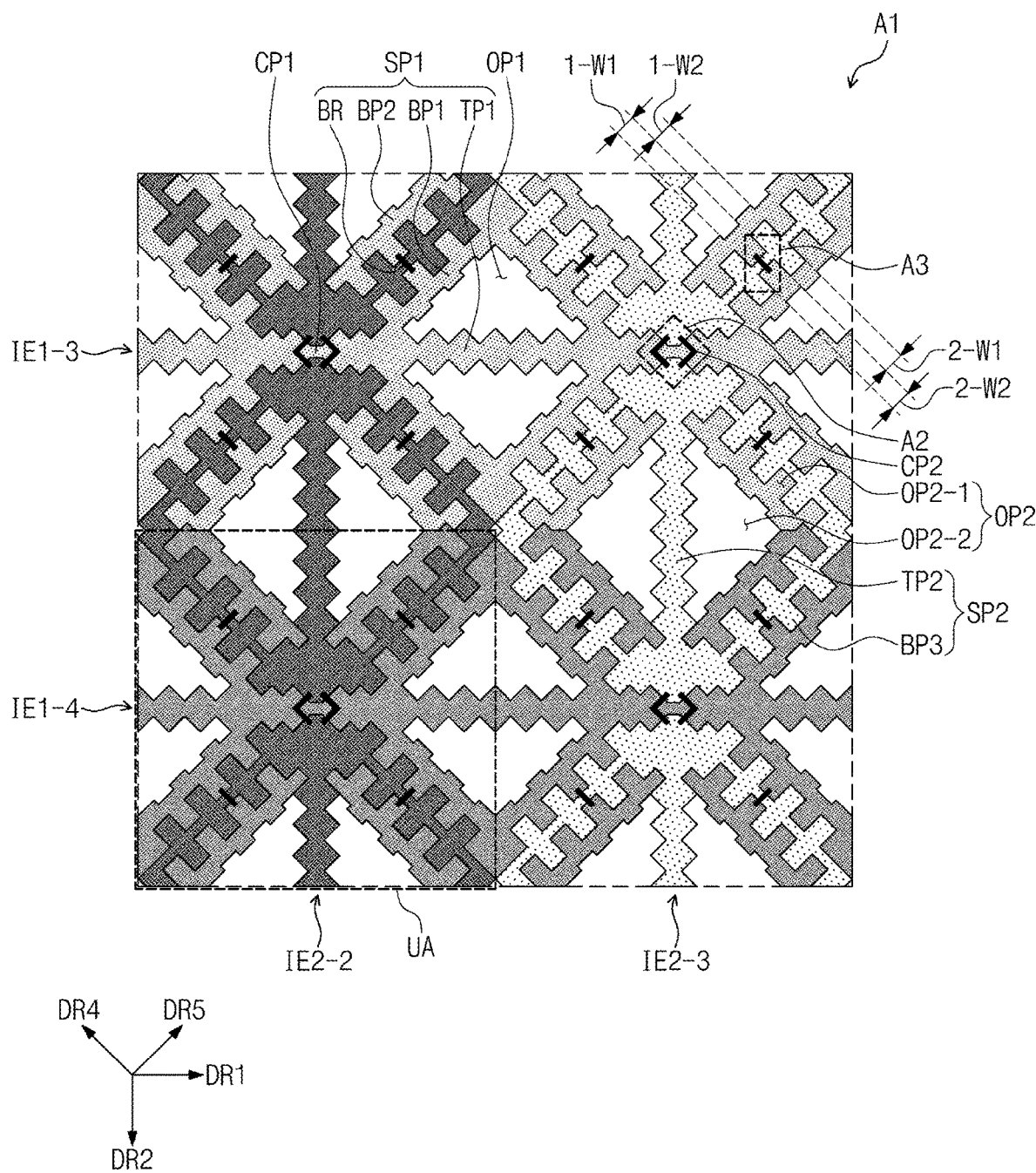
FIG. 10A is an enlarged plan view illustrating a portion of an input sensing unit according to an exemplary embodiment.
Figure 10B:
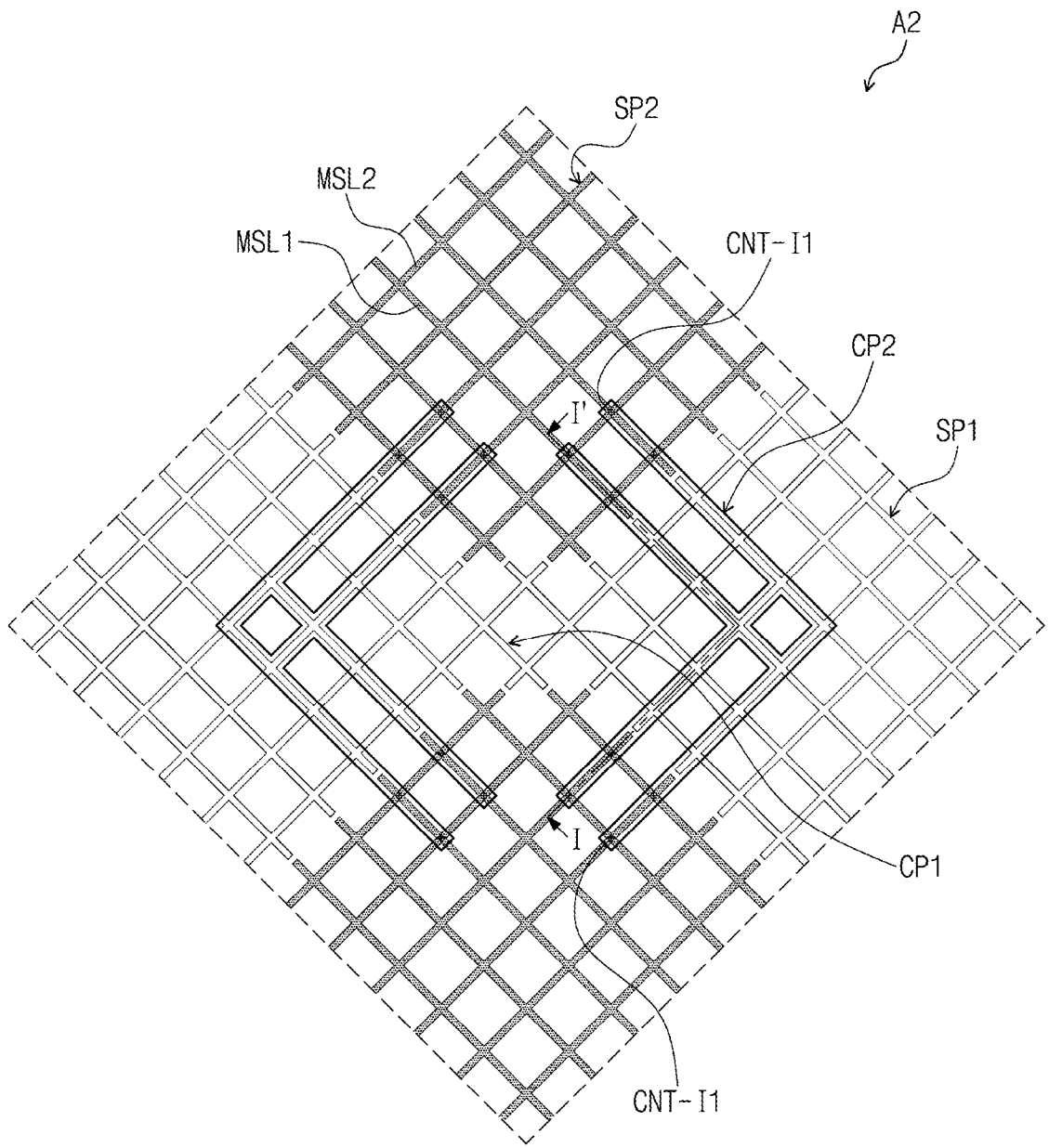
FIG. 10B is an enlarged plan view illustrating one intersection area of an input sensing unit according to an exemplary embodiment.
Figure 10C:
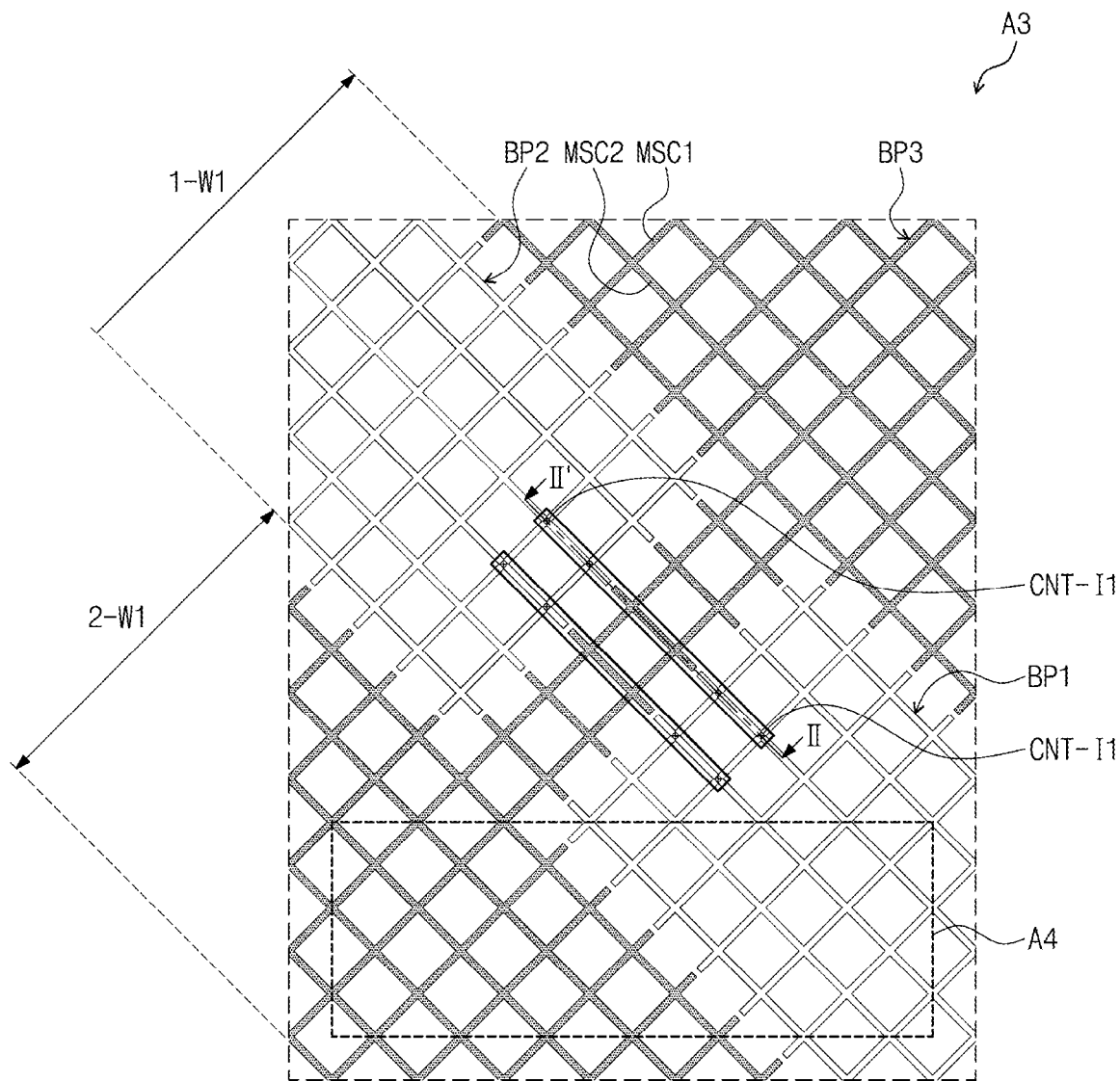
FIG. 10C is an enlarged plan view illustrating a partial area of FIG. 10A.
Figure 10C:
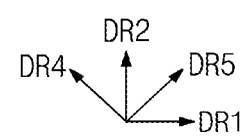
Figure 10D:
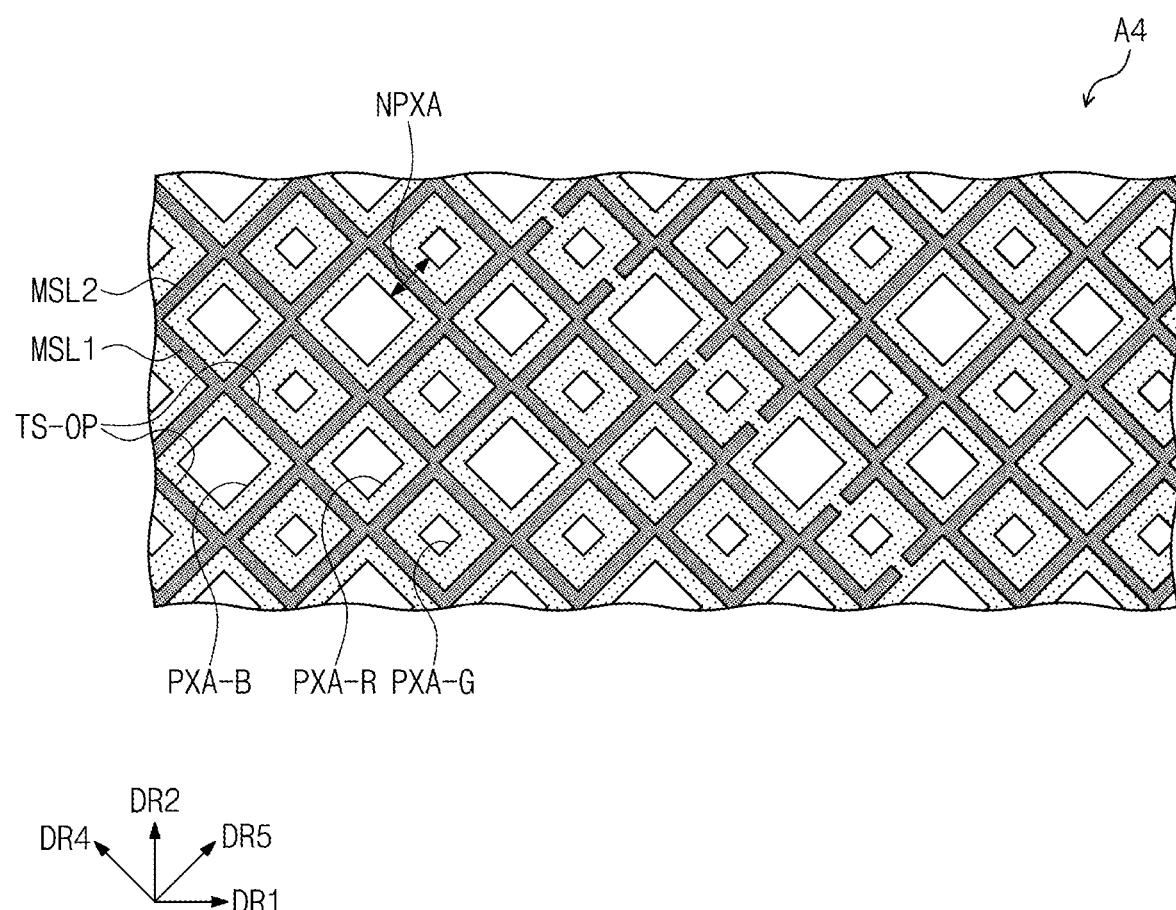
FIG. 10D is an enlarged plan view illustrating a partial area of FIG. 10C.
Figure 10E:
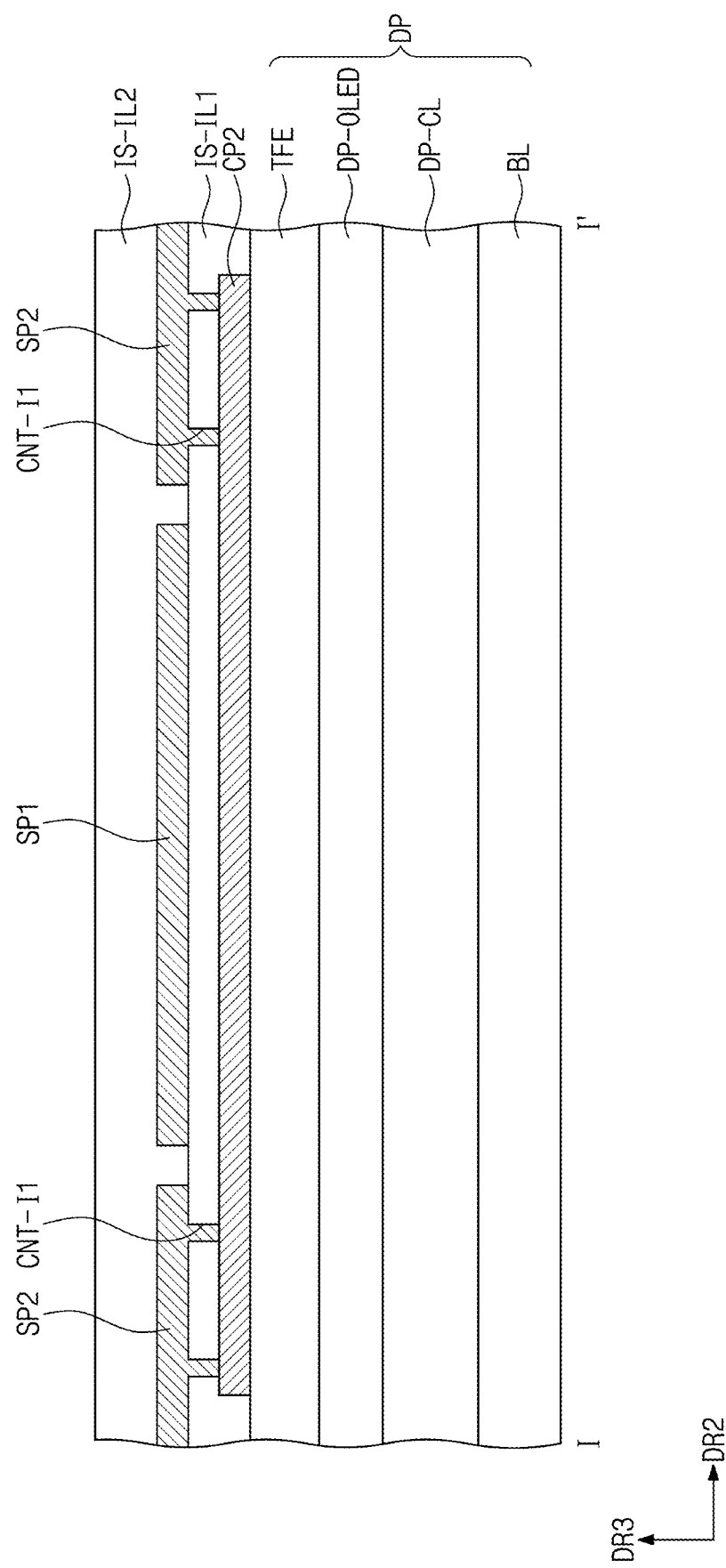
FIG. 10E is a cross-sectional view of a partial area of FIG. 10B taken along line I-I'.
Figure 10F:
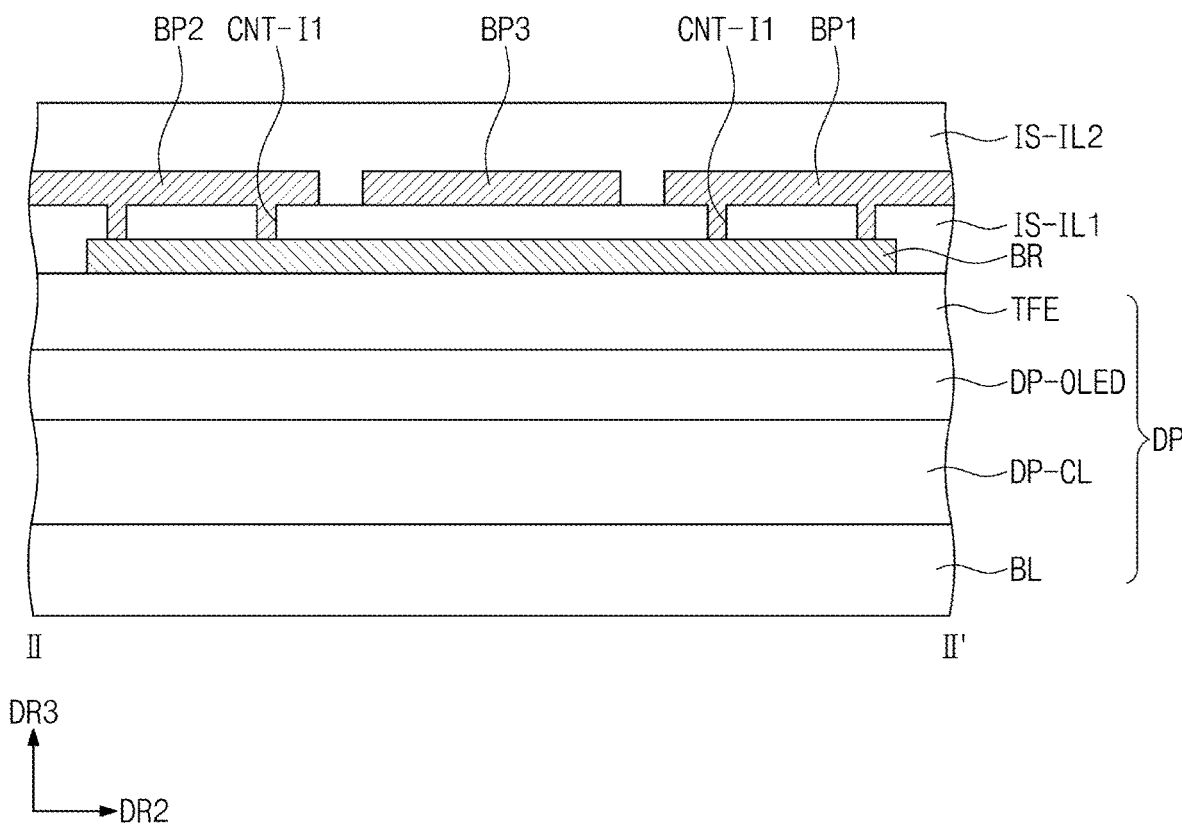
FIG. 10F is a cross-sectional view of a partial area of FIG. 10C taken along line II-II'.

FIG. 10A is an enlarged plan view illustrating a portion of an input sensing unit ISU according to an exemplary embodiment of the invention. FIG. 10B is an enlarged plan view illustrating one intersection area of the input sensing unit ISU according to an exemplary embodiment of the invention. FIG. 10C is an enlarged plan view illustrating a partial area of FIG. 10A. FIG. 10D is an enlarged plan view illustrating a partial area of FIG. 10C. FIG. 10E is a cross-sectional view of a partial area of FIG. 10B taken along line I-I'. FIG. 10F is a cross-sectional view of a partial area of FIG. 10C taken along line II-II'.

Two first sensing electrodes IE1-3 and IE1-4 and two second sensing electrodes IE2-2 and IE2-3 are shown in different shades in FIG. 10A. FIGS. 10A to 10F illustrate the input sensing unit ISU, in which two second connection parts CP2 are disposed in each of the intersection areas, as an example.

As described with reference to FIG. 8, the first opening OP1 is defined in the first sensor part SP1 illustrated in FIG. 10A. The second opening OP2 is defined in the second sensor part SP2. The second opening OP2 may include a first area OP2-1 in which the second branch portion BP2 is disposed, and a second area OP2-2 in which the second branch portion BP2 is not disposed.

One unit area UA is additionally indicated in FIG. 10A. A ratio of an area of an opening to an area of the one unit area UA may range from 25% to 35%. The area of the opening is a sum of an area of the first opening OP1 and an area of the second area OP2-2. A ratio of a total area of the electrodes in the unit area UA to the area of the unit area UA may range from 65% to 75%. In the unit area UA, a ratio of an area of the second sensing electrode IE2-2 or IE2-3 to the total area of the electrodes may range from about 38% to about 48%.

Since the area of the second sensing electrode IE2-2 or IE2-3 is smaller than an area of the first sensing electrode IE1-3 or IE1-4 in the unit area UA, the capacitance $C_{ft}$ of FIG. 9 may be relatively reduced. The capacitance $C_{ft}$, defined by the second sensing electrodes IE2-2 and IE2-3, of the two capacitances $C_{ft}$ and $C_{fr}$ may further affect the occurrence of the noise (e.g., re-transmission) in terms of a signal flow. However, since the capacitance $C_{ft}$ is reduced, the noise may be reduced.

As illustrated in FIG. 10A, each of the first and second branch portions BP1 and BP2 includes a plurality of first areas 1-W1 and a plurality of second areas 1-W2. The first areas 1-W1 and the second areas 1-W2 are alternately arranged. Widths of the first areas 1-W1 are greater than widths of the second areas 1-W2. The third branch portion BP3 includes a plurality of third areas 2-W1 and a plurality of fourth areas 2-W2. The third areas 2-W1 and the fourth areas 2-W2 are alternately arranged. Widths of the third areas 2-W1 are greater than widths of the fourth areas 2-W2. In FIG. 10A, the widths may be defined as lengths in the fourth direction DR4.

One of the first areas 1-W1 is disposed between adjacent two of the third areas 2-W1. In other words, each of the first, second and third branch portions BP1, BP2 and BP3 does not have a uniform width but includes an area having a large width and an area having a small width. The areas having the large widths and the areas having the small widths are alternately arranged. The areas having the large widths of the first branch portion BP1 and the second branch portion BP2 may be disposed between the areas having the large widths of the third branch portion BP3.

As illustrated in FIGS. 10A to 10D, the first sensing electrodes IE1-3 and IE1-4 and the second sensing electrodes IE2-2 and IE2-4 may have mesh shapes. The first sensor part SP1, the second sensor part SP2, the first connection part CP1 and the second connection part CP2 may include mesh lines MSL1 and MSL2. The mesh lines MSL1 and MSL2 may include lines MSL1 extending in the fourth direction DR4 and lines MSL2 extending in the fifth direction DR5.

As illustrated in FIG. 10B, a distance between the first sensor parts SP1 and the second sensor parts SP2 may be several m or less. For example, the distance may range from 1 μm to 10 μm. In particular, the distance may range from 2 μm to 4 μm. As illustrated in FIG. 10C, a distance between the first areas 1-W1 and the third areas 2-W1 may be several m or less. For example, the distance may range from 1 μm to 10 μm. In particular, the distance may range from 2 μm to 4 μm. These are because the mesh lines are separated (cut) from each other to define a boundary between the electrodes.

As illustrated in FIGS. 10B and 10E, the second connection part CP2 may be disposed on a layer different from a layer on which the first sensor part SP1, the second sensor part SP2 and the first connection part CP1 are disposed. The second sensor parts SP2 spaced apart from each other may be connected to the second connection part CP2 through contact holes CNT-I1 penetrating the first insulating layer IS-IL1. Even though not shown in the drawings, the first sensor part SP1 may be partially removed to reduce an overlapping area with the second connection part CP2.

As illustrated in FIGS. 10C and 10F, the bridge BR may be disposed on a layer different from a layer on which the first to third branch portions BP1, BP2 and BP3 are disposed. The bridge BR may be connected to the first branch portion BP1 and the second branch portion BP2 through contact holes CNT-I1 penetrating the first insulating layer IS-IL1. The bridge BR is insulated from the third branch portion BP3 and intersects the third branch portion BP3.

As illustrated in FIG. 10D, the mesh lines MSL1 and MSL2 do not overlap with light emitting areas PXA-R, PXA-G and PXA-B but overlap with a non-light emitting area NPXA. The light emitting areas PXA-R, PXA-G and PXA-B may be defined as the light emitting area PXA of FIG. 6. The mesh lines MSL1 and MSL2 define a plurality of mesh holes TS-OP. A width of the mesh lines may range from several nanometers to several micrometers. The mesh holes TS-OP may overlap with the light emitting areas PXA-R, PXA-G and PXA-B in one-to-one correspondence. The light emitting areas PXA-R, PXA-G and PXA-B classified into three groups on the basis of a color of emitted light are illustrated in FIG. 10D.

The light emitting areas PXA-R, PXA-G and PXA-B may have different areas, depending on a color of light emitted from the light emitting layer EML of the organic light emitting diode OLED (see FIG. 6). The areas of the light emitting areas PXA-R, PXA-G and PXA-B may be determined depending on kinds of the organic light emitting diodes.

The plurality of mesh holes TS-OP may be classified into a plurality of groups having different areas from each other. The plurality of mesh holes TS-OP may be classified into three groups to correspond to the light emitting areas PXA-R, PXA-G and PXA-B classified into the three groups.

In the above exemplary embodiment, the mesh holes TS-OP overlap with the light emitting areas PXA-R, PXA-G and PXA-B in one-to-one correspondence. However, exemplary embodiments of the invention are not limited thereto. In other exemplary embodiments, one mesh hole TS-OP may correspond to two or more of the light emitting areas PXA-R, PXA-G and PXA-B.

In the above exemplary embodiment, the areas of the light emitting areas PXA-R, PXA-G and PXA-B are various. However, exemplary embodiments of the invention are not limited thereto. In other exemplary embodiments, sizes of the light emitting areas PXA-R, PXA-G and PXA-B may be equal to each other, and sizes of the mesh holes TS-OP may also be equal to each other.

Figure 11:
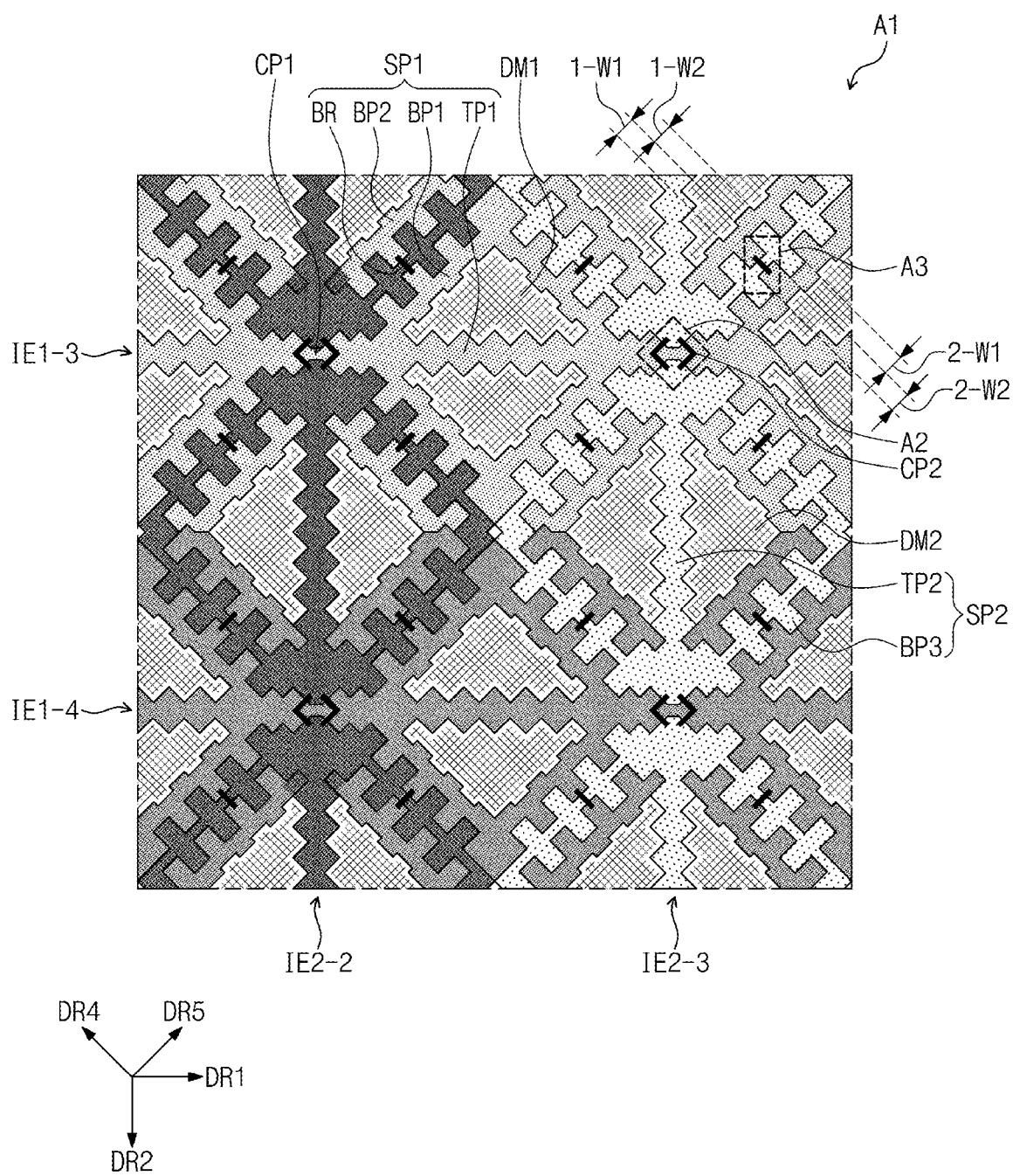
FIG. 11 is an enlarged plan view illustrating a portion of an input sensing unit according to an exemplary embodiment.

FIG. 11 is an enlarged plan view illustrating a portion of an input sensing unit ISU according to an exemplary embodiment of the invention. Hereinafter, the descriptions to the same components as in the exemplary embodiments of FIGS. 1 to 10F will be omitted for the purpose of ease and convenience in description.

An input sensing unit ISU may further include optical dummy electrodes DM1 and DM2. A first dummy electrode DM1 is disposed in the first opening OP1, and a second dummy electrode DM2 is disposed in the second area OP2-2 of the second opening OP2. The optical dummy electrodes DM1 and DM2 may be formed by the same process as the first sensor parts SP1 and the second sensor parts SP2, and thus the optical dummy electrodes DM1 and DM2 may have the same material and the same stack structure as the first sensor parts SP1 and the second sensor parts SP2.

The optical dummy electrodes DM1 and DM2 are floating electrodes and are not electrically connected to the first sensor parts SP1 and the second sensor parts SP2. The optical dummy electrodes DM1 and DM2 may be disposed to reduce visibility of a boundary area between the first sensor parts SP1 and the second sensor parts SP2. The optical dummy electrodes DM1 and DM2 may have mesh shapes and may be spaced apart from corresponding sensor parts by a distance of several m. For example, the distance may range from 1 μm to 10 μm. In particular, the distance may range from 2 μm to 4 μm.

Figure 12A:
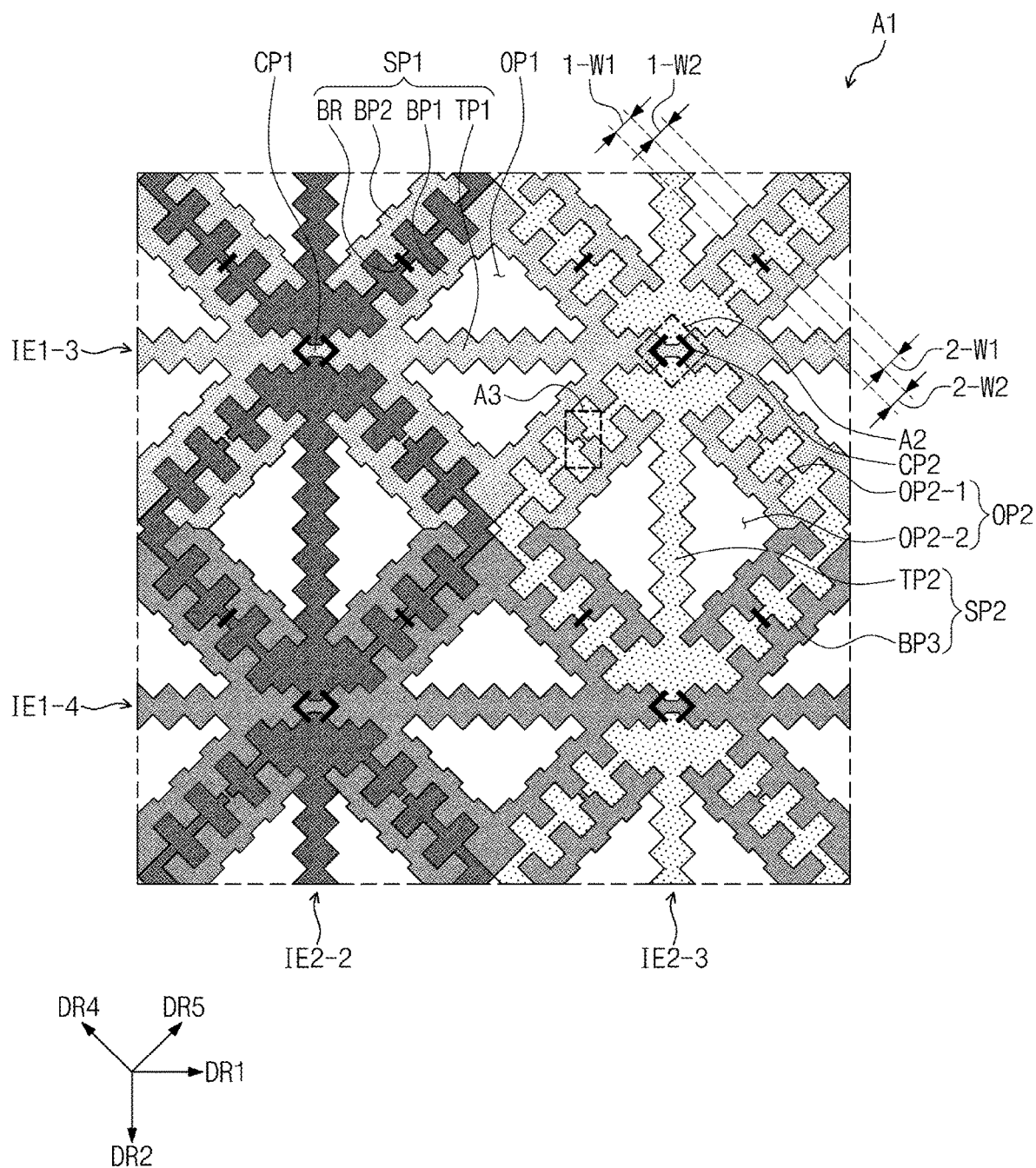
FIG. 12A is an enlarged plan view illustrating a portion of an input sensing unit according to an exemplary embodiment.
Figure 12B:
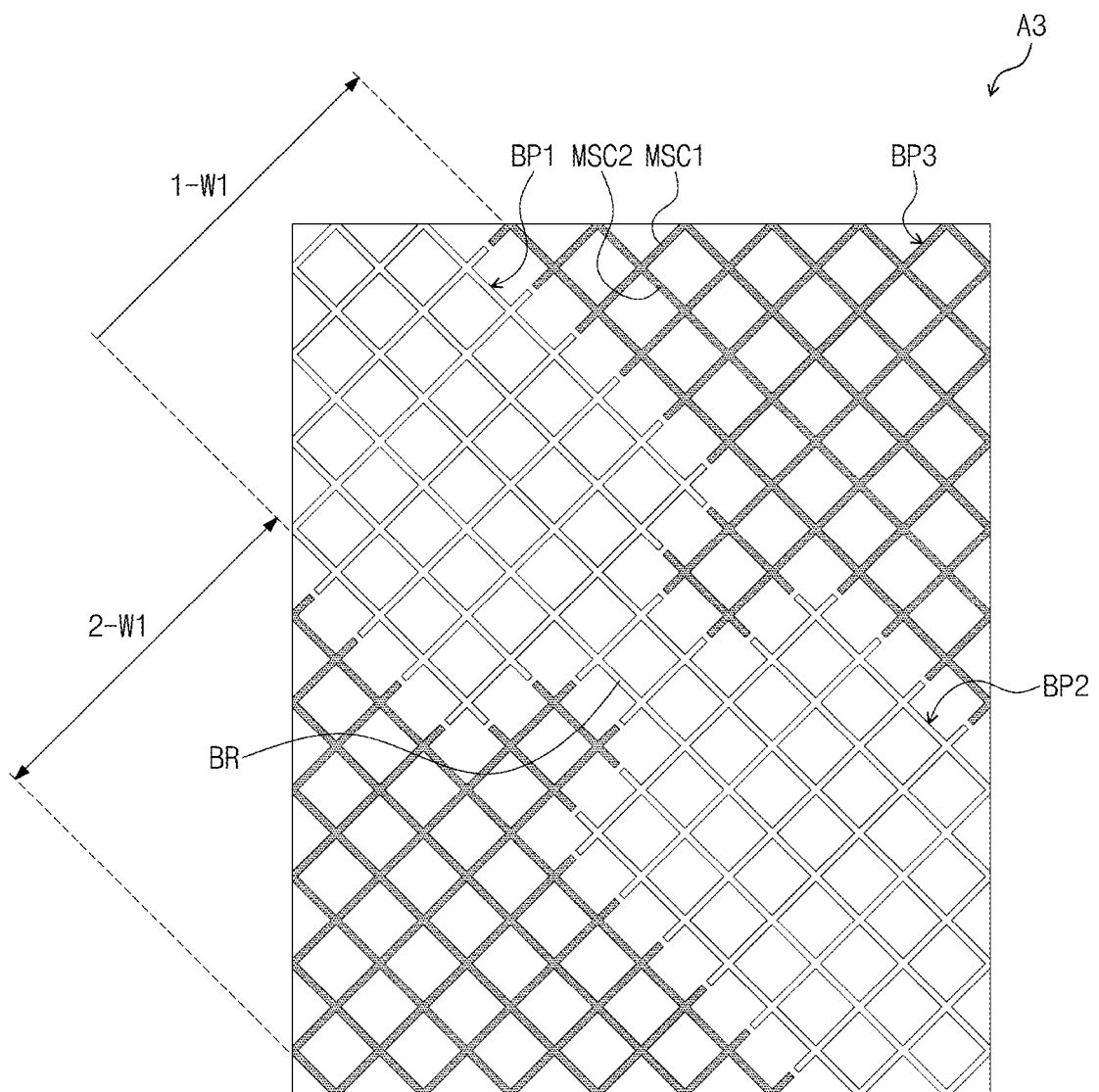
FIG. 12B is an enlarged plan view illustrating a partial area of FIG. 12A.
Figure 13:
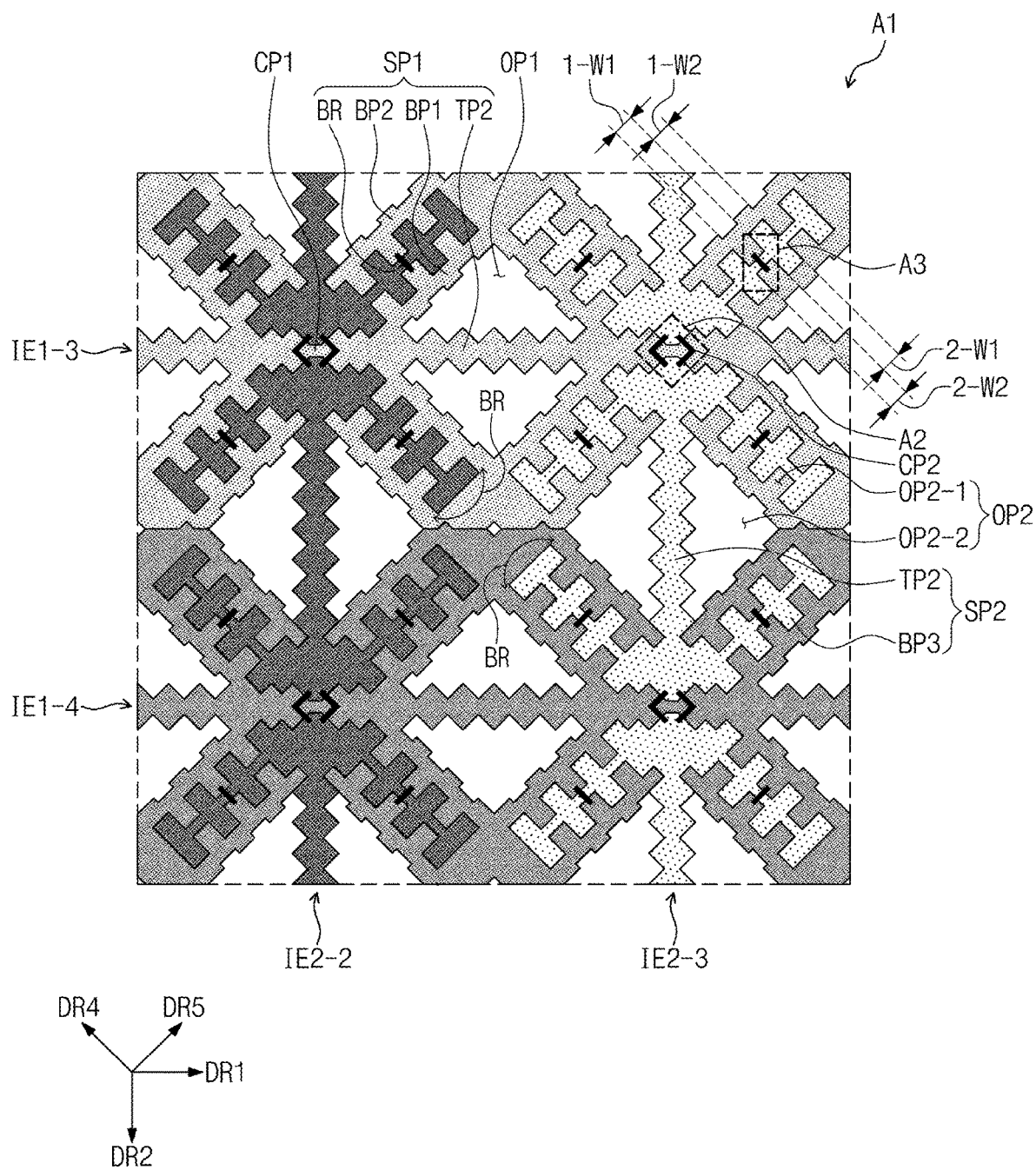
FIG. 13 is an enlarged plan view illustrating a portion of an input sensing unit according to an exemplary embodiment.

FIG. 12A is an enlarged plan view illustrating a portion of an input sensing unit ISU according to an exemplary embodiment of the invention. FIG. 12B is an enlarged plan view illustrating a partial area of FIG. 12A. FIG. 13 is an enlarged plan view illustrating a portion of an input sensing unit according to an exemplary embodiment of the invention.

As illustrated in FIGS. 12A and 12B, a shape of a third branch portion BP3 of an input sensing unit ISU according to the present exemplary embodiment is different from the shape of the third branch portion BP3 of the input sensing unit ISU illustrated in FIG. 10A. Two third branch portions BP3 disposed at a left side of the second trunk portion TP2 will be mainly described. One of the two third branch portions BP3 is connected to the one end area of the second trunk portion TP2, and the other thereof is connected to the another end area of the second trunk portion TP2. The two third branch portions BP3 are spaced apart from each other by a predetermined distance. The two third branch portions BP3 may have different lengths from each other. The third branch portion BP3 having a longer length includes a portion extending in the fourth direction DR4 and a portion extending in the fifth direction DR5.

A bridge BR is disposed between the two third branch portions BP3 spaced apart from each other. The bridge BR and the first and second branch portions BP1 and BP2 may constitute a single unitary body. In the present exemplary embodiment, the input sensing unit ISU includes two kinds of bridges. One kind of the bridge BR is disposed on the same layer as the third branch portions BP3, and another kind of the bridge BR is disposed on a layer different from the layer on which the third branch portions BP3 are disposed. This was described in detail with reference to FIG. 10F, and thus the descriptions thereto are omitted.

As illustrated in FIG. 13, two third branch portions BP3 disposed at the same side of the second trunk portion TP2 are not connected to each other in an input sensing unit ISU according to the present exemplary embodiment, unlike the input sensing unit ISU illustrated in FIG. 10A. One of the two third branch portions BP3 is connected to the one end area of the second trunk portion TP2, and the other thereof is connected to the another end area of the second trunk portion TP2. The two third branch portions BP3 are spaced apart from each other by a predetermined distance. Lengths of the two third branch portions BP3 may be equal to each other.

A bridge BR is disposed between the third branch portions BP3 spaced apart from each other. The bridge BR and the first and second branch portions BP1 and BP2 may constitute a single unitary body. The first branch portion BP1, the second branch portion BP2 and the bridge BR may completely surround the third branch portion BP3 corresponding thereto.

Figure 14A:
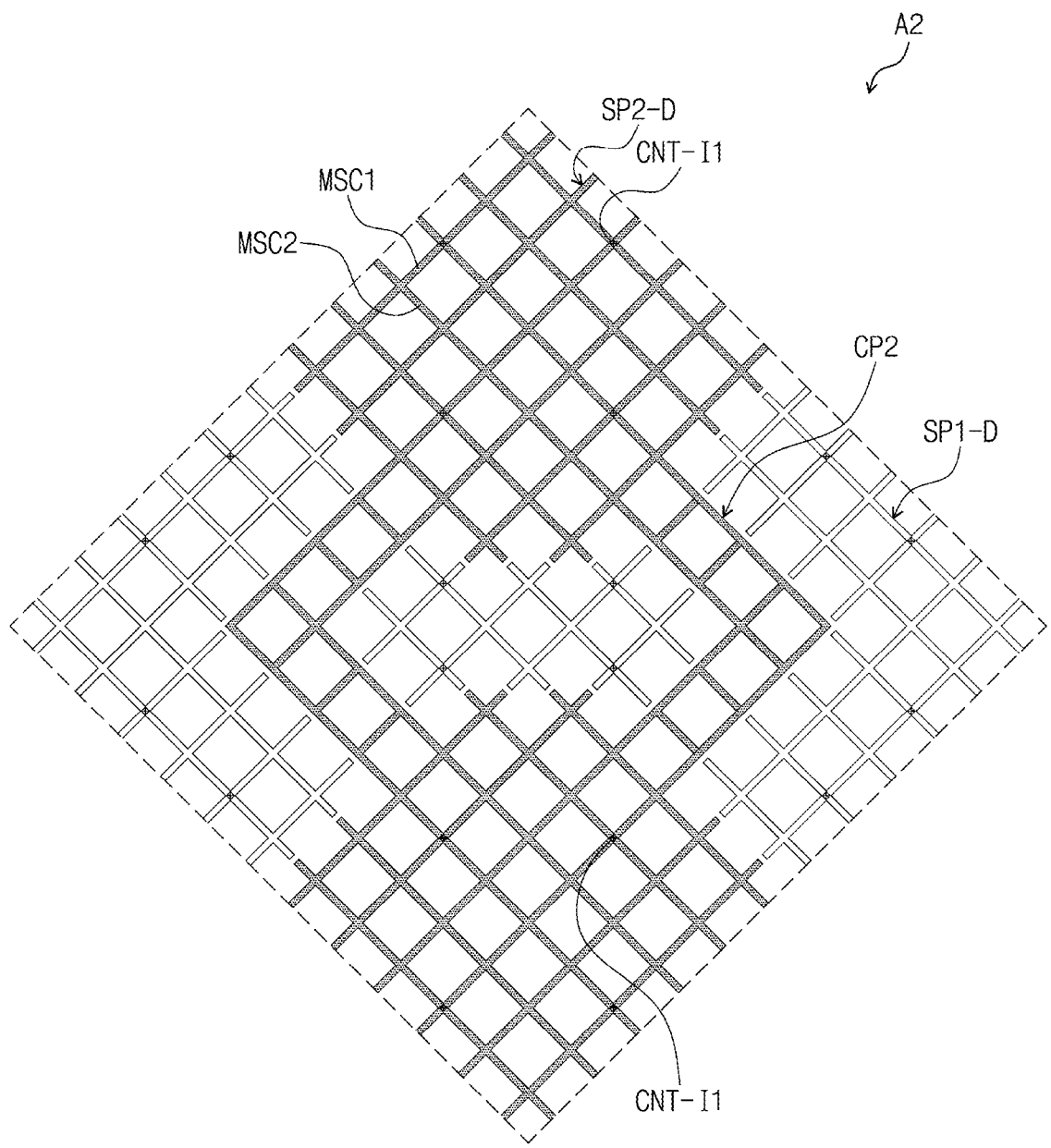
FIG. 14A is an enlarged plan view illustrating a first conductive layer corresponding to one intersection area of an input sensing unit according to an exemplary embodiment.
Figure 14B:
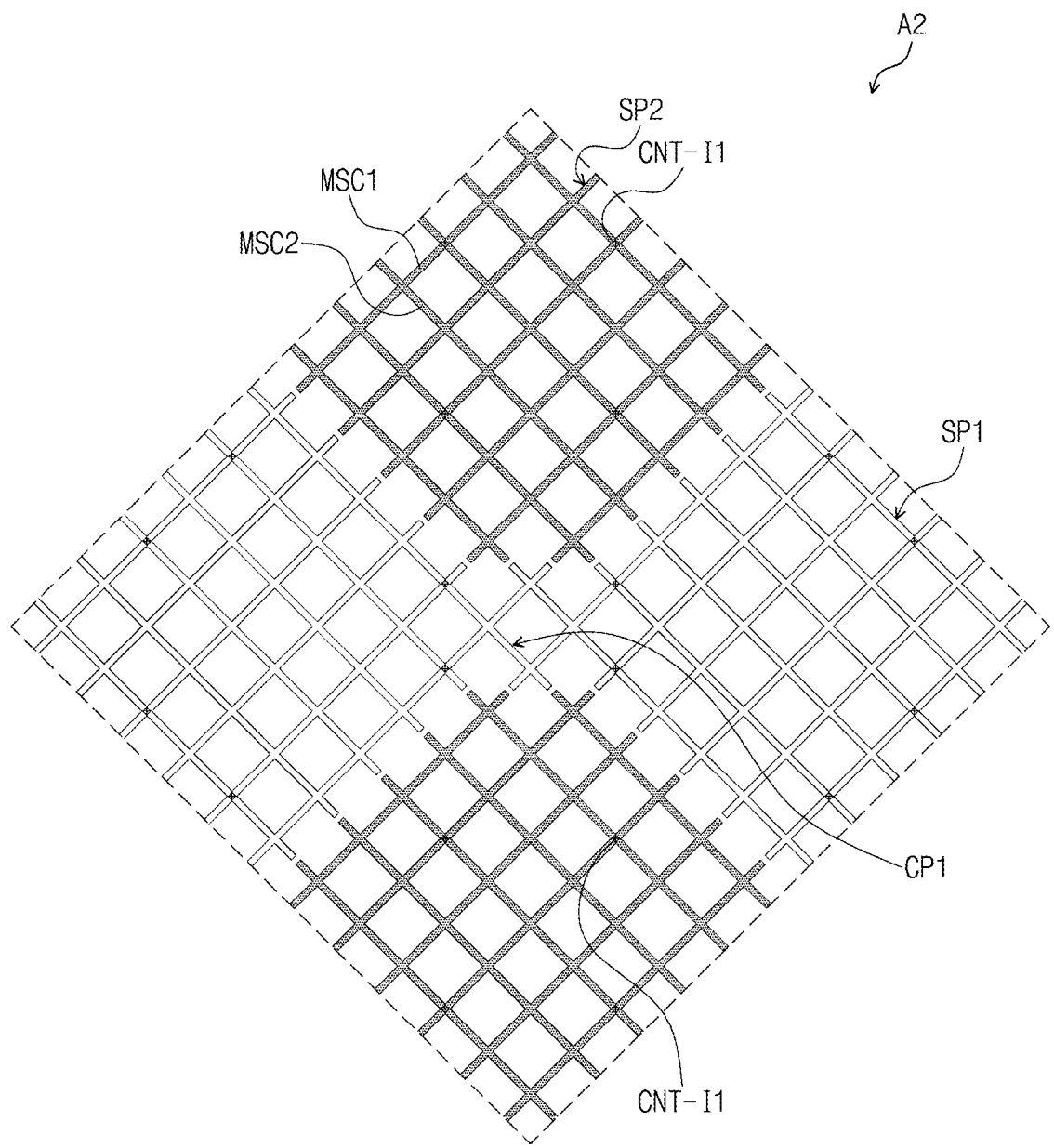
FIG. 14B is an enlarged plan view illustrating a second conductive layer corresponding to one intersection area of an input sensing unit according to an exemplary embodiment.
Figure 14B:
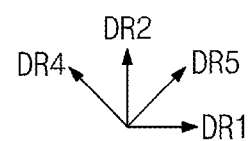

FIG. 14A is an enlarged plan view illustrating a first conductive layer IS-CL1 (see FIG. 7) corresponding to one intersection area of an input sensing unit ISU according to an exemplary embodiment of the invention. FIG. 14B is an enlarged plan view illustrating a second conductive layer IS-CL2 (see FIG. 7) corresponding to one intersection area of the input sensing unit ISU according to an exemplary embodiment of the invention.

In the input sensing unit ISU according to the present exemplary embodiment, the second connection parts CP2 are formed from the first conductive layer IS-CL1, and the first and second sensor parts SP1 and SP2 and the first connection parts CP1 are formed from the second conductive layer IS-CL2. In the present exemplary embodiment, first dummy electrodes SP1-D and second dummy electrodes SP2-D may further be formed from the first conductive layer IS-CL1. The second dummy electrodes SP2-D may be connected to each other through the second connection parts CP2.

The first dummy electrodes SP1-D are connected to the first sensor parts SP1 through contact holes CNT-I1. The second dummy electrodes SP2-D may be connected to the second sensor parts SP2 through contact holes CNT-I1. The first dummy electrodes SP1-D and the second dummy electrodes SP2-D may reduce resistances of the first sensing electrodes IE1-1 to IE1-5 and the second sensing electrodes IE2-1 to IE2-4.

According to the above descriptions, the variation in capacitance between before and after the inputting of the input means may increase. Sensitivity of the input sensing unit may be improved. This is because the facing area between the first and second sensing electrodes is increased and the overlapping areas of the input means and the first and second sensing electrodes are reduced.

Since the first and second sensing electrodes include the trunk portions, current paths may be secured. Areas (e.g., the openings) from which portions of the first and second sensing electrodes are removed may be defined to reduce the capacitance(s) between the input means and the first and/or second sensing electrode. Thus, it is possible to inhibit or prevent the variation in capacitance from being reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
   a display panel; and
   a sensing unit disposed on the display panel and comprising a first sensing electrode extending in a first direction and a second sensing electrode extending in a second direction crossing the first direction, wherein:
the first sensing electrode comprises a first extension extending in the first direction, a first branch portion extended from the first extension, and a second branch portion extended from the first extension;
the second sensing electrode comprises a second extension extending in the second direction, a first branch extended from the second extension, and a second branch extended from the second extension;
the first branch comprises a third branch portion extended from the second extension, a fourth branch portion, and a first bridge portion disposed between the third branch portion and the fourth branch portion, and the first bridge portion is spaced apart from the second extension;
the second branch comprises a fifth branch portion extended from the second extension, a sixth branch portion, and a second bridge portion disposed between the fifth branch portion and the sixth branch portion, and the second bridge portion is spaced apart from the second extension;
the first branch portion is disposed between the third branch portion and the fourth branch portion; and
the second branch portion is disposed between the fifth branch portion and the sixth branch portion.

2. The display device of claim 1, wherein one of the first extension and the second extension has single unitary body.

3. The display device of claim 1, wherein:
the first extension includes a first trunk portion and a second trunk portion, and a first connection part between the first trunk portion and the second trunk portion; and
the second extension includes a third trunk portion and a fourth trunk portion, and a second connection part between the third trunk portion and the fourth trunk portion.

4. The display device of claim 3, wherein the first branch portion is extended from the first trunk portion and the second branch portion is extended from the second trunk portion.

5. The display device of claim 3, wherein the second extension is disposed between the first branch and the second branch in the first direction.

6. The display device of claim 3, wherein the first connection part or the second connection part are disposed on a layer different from a layer on which the first trunk portion and the third trunk portion are disposed.

7. The display device of claim 1, wherein:
the first branch portion comprises first areas and second areas, wherein the first areas and the second areas are alternately arranged in a first diagonal direction; and
a width of each of the first areas is greater than a width of each of the second areas in a second diagonal direction orthogonal to the first diagonal direction.

8. The display device of claim 1, wherein each of the first sensing electrode and the second sensing electrode has a mesh shape.

9. The display device of claim 1, wherein the first branch portion, the third branch portion, and the fourth branch portion are extended in a same direction.

10. The display device of claim 1, wherein the first branch portion, the third branch portion, and the fourth branch portion are disposed side-by-side.

11. The display device of claim 1, wherein:
the first sensing electrode further comprises a seventh branch portion extended from the first extension and an eighth branch portion extended from the first extension; and
the first branch portion and the second branch portion are disposed on a first side of the first extension and the seventh branch portion and the eighth branch portion are disposed on a second side of the first extension.

12. The display device of claim 11, wherein:
the first branch portion and the eighth branch portion extend in opposite directions from each other from the first extension; and
the second branch portion and the seventh branch portion extend in opposite directions from each other from the first extension.

13. The display device of claim 1, wherein:
the first branch portion is extended in a first diagonal direction crossing the first direction and the second direction; and
the second branch portion is extended in a second diagonal direction crossing to the first diagonal direction.

14. The display device of claim 1, wherein:
a portion of the first extension includes a plurality of first regions and a plurality of second regions alternately arranged in the first direction; and
a width in the second direction of each of the plurality of first regions increases along the first direction and a width in the second direction of each of the plurality of second regions decreases along the first direction.

15. The display device of claim 1, wherein the first bridge portion directly connects the third branch portion to the fourth branch portion.

16. The display device of claim 1, wherein the third branch portion, the fourth branch portion, and the first bridge portion constitute a single unitary body.

17. A display device comprising:
a display panel; and
a sensing unit disposed on the display panel and comprising a first sensing electrode extending in a first direction and a second sensing electrode extending in a second direction crossing the first direction,
wherein:
the first sensing electrode comprises a first extension extending in the first direction, a first diagonal portion extended from the first extension, and a second diagonal portion extended from the first extension;
the second sensing electrode comprises a second extension extending in the second direction, a third diagonal portion extended from the second extension, a fourth diagonal portion, a first bridge portion disposed between the third diagonal portion and the fourth diagonal portion, a fifth diagonal portion extended from the second extension, a sixth diagonal portion, and a second bridge portion disposed between the fifth diagonal portion and the sixth diagonal portion;
the first diagonal portion is disposed between the third diagonal portion and the fourth diagonal portion, and an end of the first diagonal portion spaced apart from the first extension is adjacent to the first bridge portion;
the second diagonal portion is disposed between the fifth diagonal portion and the sixth diagonal portion, and an end of the second diagonal portion spaced apart from the first extension is adjacent to the second bridge portion;
the third diagonal portion is disposed between the second extension and the first bridge portion; and the fifth diagonal portion is disposed between the second extension and the second bridge portion.

18. The display device of claim 17, wherein:
the first diagonal portion is extended in a first diagonal direction crossing the first direction and the second direction; and
the second diagonal portion is extended in a second diagonal direction crossing to the first diagonal direction.

19. The display device of claim 17, wherein the second extension is disposed between the first diagonal portion and the second diagonal portion in the first direction.

20. The display device of claim 17, wherein:
one of the first extension and the second extension has single unitary body;
the other one of the first extension and the second extension includes trunk portions and a connection part;
the connection part connects the trunk portions; and
the connection part is disposed on a layer different from a layer on which the trunk portions and the one of the first extension and the second extension is disposed.

21. The display device of claim 17, wherein the first diagonal portion, the third diagonal portion, and the fourth diagonal portion are extended in a same direction.

22. The display device of claim 17, wherein the first diagonal portion, the third diagonal portion, and the fourth diagonal portion are disposed side-by-side.

23. A display device comprising:
a display panel; and
a sensing unit disposed on the display panel and comprising a first sensing electrode extending in a first direction and a second sensing electrode extending in a second direction crossing the first direction,
wherein:
the first sensing electrode comprises a first extension extending in the first direction, a first branch portion extended from the first extension, and a second branch portion extended from the first extension;
the second sensing electrode comprises a second extension extending in the second direction, a first branch extended from the second extension, and a second branch extended from the second extension;
the first branch comprises a third branch portion extended from the second extension and a fourth branch portion, the third branch portion and the fourth branch portion constitute a single unitary body;
the second branch comprises a fifth branch portion extended from the second extension, and a sixth branch portion, the fifth branch portion and the sixth branch portion constitute a single unitary body;
the first branch portion is disposed between the third branch portion and the fourth branch portion;
the second branch portion is disposed between the fifth branch portion and the sixth branch portion;
the first branch portion and the second branch portion extend in opposite directions from each other from the first extension, and
the first branch and the second branch extend in opposite directions from each other from the second extension.

24. The display device of claim 23, wherein the first branch portion is disposed on a first side of the second extension and the second branch portion is disposed on a second side of the second extension.

25. The display device of claim 24, wherein the first branch is disposed on the first side of the second extension and the second branch is disposed on the second side of the second extension.

26. The display device of claim 23, wherein the first branch portion and the second branch portion are placed on a same line.

27. The display device of claim 23, wherein:
the first extension includes a first trunk portion and a second trunk portion, and a first connection part between the first trunk portion and the second trunk portion; and
the second extension includes a third trunk portion and a fourth trunk portion, and a second connection part between the third trunk portion and the fourth trunk portion.

28. The display device of claim 27, wherein the first connection part is disposed between the first branch portion and the second branch portion in a direction in which the first branch portion and the second branch portion extend.

29. The display device of claim 27, wherein the first connection part or the second connection part is disposed on a layer different from a layer on which the first trunk portion and the third trunk portion are disposed.

30. The display device of claim 27, wherein:
the first trunk portion includes a plurality of first regions and a plurality of second regions alternately arranged in the first direction; and
a width in the second direction of each of the plurality of first regions increases along the first direction and a width in the second direction of each of the plurality of second regions decreases along the first direction.

* * * * *